(12) United States Patent
Chen et al.

(10) Patent No.: US 8,809,079 B2
(45) Date of Patent: Aug. 19, 2014

(54) MATERIALS AND METHODS FOR ORGANIC LIGHT-EMITTING DEVICE MICROCAVITY

(75) Inventors: Jianglong Chen, San Jose, CA (US); Ian Millard, Menlo Park, CA (US); Steven Van Slyke, Menlo Park, CA (US); Inna Tregub, San Jose, CA (US); Conor Madigan, San Francisco, CA (US)

(73) Assignee: Kateeva, Inc., Menlo Park, CA (US)

( * ) Notice: Subject to any disclaimer, the term of this patent is extended or adjusted under 35 U.S.C. 154(b) by 0 days.

(21) Appl. No.: 13/528,896

(22) Filed: Jun. 21, 2012

(65) Prior Publication Data

US 2013/0153866 A1    Jun. 20, 2013

Related U.S. Application Data

(63) Continuation of application No. 13/360,597, filed on Jan. 27, 2012, now Pat. No. 8,466,484, and a continuation-in-part of application No. 13/333,867, filed on Dec. 21, 2011, now abandoned.

(60) Provisional application No. 61/499,465, filed on Jun. 21, 2011, provisional application No. 61/499,496, filed on Jun. 21, 2011.

(51) Int. Cl.
| | |
|---|---|
| *H01L 33/02* | (2010.01) |
| *H01L 51/00* | (2006.01) |
| *H01L 33/00* | (2010.01) |
| *H01L 51/52* | (2006.01) |
| *H01L 33/12* | (2010.01) |

(52) U.S. Cl.
CPC ............ *H01L 51/0005* (2013.01); *H01L 33/12* (2013.01); *H01L 33/0095* (2013.01); *H01L 51/5265* (2013.01); *H01L 51/5262* (2013.01)
USPC .......................................... 438/22

(58) Field of Classification Search
CPC ... H01L 33/005; H01L 33/0095; H01L 33/12; H01L 33/16; H01L 33/18; H01L 51/0005; H01L 51/5265; H01L 51/5262
USPC ......... 438/22, 29; 257/98, E33.001, E33.002, 257/E33.069; 313/506
See application file for complete search history.

(56) References Cited

U.S. PATENT DOCUMENTS

| | | | |
|---|---|---|---|
| 6,660,411 | B2 | 12/2003 | Sato et al. |
| 6,685,524 | B2 | 2/2004 | Takashi et al. |

(Continued)

FOREIGN PATENT DOCUMENTS

| | | |
|---|---|---|
| WO | WO 2010/140629 | 12/2010 |
| WO | WO 2011025455 A1 * | 3/2011 |

OTHER PUBLICATIONS

Wu et al., Microcavity Effects in Organic Light-Emitting Devices, Chapter 9, pp. 265-291 in Organic Electronics Materials, Processing, Devices and Applications, (So, ed.), CRC Press New York (2010).*

(Continued)

*Primary Examiner* — Michelle Fan

(57) ABSTRACT

The present teachings provide methods for forming organic layers for an organic light-emitting device (OLED) using an inkjet printing or thermal printing process. The method can further use one or more additional processes, such as vacuum thermal evaporation (VTE), to create an OLED stack. OLED stack structures are also provided wherein at least one of the charge injection or charge transport layers is formed by an inkjet printing or thermal printing method at a high deposition rate. The structure of the organic layer can be amorphous, crystalline, porous, dense, smooth, rough, or a combination thereof, depending on deposition parameters and post-treatment conditions. An OLED microcavity is also provided and can be formed by one of more of the methods.

19 Claims, 14 Drawing Sheets

(56) References Cited

U.S. PATENT DOCUMENTS

| | | | |
|---|---|---|---|
| 8,057,916 | B2 | 11/2011 | Hatwar et al. |
| 2002/0173617 | A1* | 11/2002 | Yasuda et al. ............ 528/422 |
| 2004/0151829 | A1 | 8/2004 | Boroson et al. |
| 2005/0003667 | A1 | 1/2005 | Lin et al. |
| 2005/0070037 | A1* | 3/2005 | Robeson et al. ............ 438/29 |
| 2005/0081984 | A1 | 4/2005 | Afzali-Ardakani et al. |
| 2005/0099118 | A1 | 5/2005 | Kobayashi |
| 2005/0147739 | A1* | 7/2005 | Yamazaki et al. ............ 427/66 |
| 2005/0184653 | A1 | 8/2005 | Suh et al. |
| 2006/0063027 | A1 | 3/2006 | Vestweber et al. |
| 2006/0175961 | A1* | 8/2006 | Choong ............ 313/506 |
| 2006/0273713 | A1* | 12/2006 | Mehta et al. ............ 313/504 |
| 2007/0281386 | A1* | 12/2007 | Park ............ 438/99 |
| 2008/0108157 | A1* | 5/2008 | Matsuda et al. ............ 438/22 |
| 2009/0032807 | A1 | 2/2009 | Shinohara et al. |
| 2009/0050206 | A1* | 2/2009 | Halls et al. ............ 136/263 |
| 2009/0130296 | A1* | 5/2009 | Kwong et al. ............ 427/64 |
| 2009/0221107 | A1 | 9/2009 | Yamazaki et al. |
| 2010/0212726 | A1* | 8/2010 | Noguchi et al. ............ 136/252 |
| 2010/0231490 | A1 | 9/2010 | Okano |
| 2010/0244693 | A1* | 9/2010 | Kawakami et al. ............ 315/32 |
| 2010/0314638 | A1* | 12/2010 | Fukuda ............ 257/89 |
| 2011/0006288 | A1* | 1/2011 | Katayama et al. ............ 257/40 |
| 2011/0008589 | A1 | 1/2011 | Simon et al. |
| 2011/0008590 | A1 | 1/2011 | Goddard et al. |
| 2011/0114927 | A1 | 5/2011 | Obana et al. |
| 2012/0068171 | A1 | 3/2012 | Yamana et al. |
| 2012/0126273 | A1* | 5/2012 | Korotkov et al. ............ 257/98 |
| 2012/0225205 | A1 | 9/2012 | Yamazaki et al. |

OTHER PUBLICATIONS

Lee et al., "Cavity effects on light extraction in organic light emitting devices" Applied Physics Letters, 92, 033303 (2008): pp. 1-3.*

Bulovic et al., "Week microcavity effects in organic light-emititng devies" Physical Review B, 58, 7 (1998): pp. 3730-3740.*

Geffroy et al., "Organic light-emitting diode (OLED) technology: material devices and display technologies," Polym., Int., 55:572-582 (2006).*

Chin, "Effective hole transport layer structure for top-emitting organic light emitting devices based on laser transfer patterning," J. Phys. D: Appl. Phys. 40:5541-5546 (2007).*

Lee et al., "Microcavity Effect of Top-Emission Organic Light-Emitting Diodes Using Aluminum Cathode and Anode," Bull. Korean Chem. Soc., 2005, vol. 26, No. 9.*

Notice of Allowance issued on Feb. 28, 2013, to U.S. Appl. No. 13/360,597.

Notice of Allowance issued on Apr. 29, 2013, to U.S. Appl. No. 13/360,597.

Non-Final Office Action issued on May 10, 2013, to U.S. Appl. No. 13/333,867.

Kim et al., "Negative Temperature Dependance of Conductivity in Pentacene Thin Film Deposited Au Electrode," Journal of the Physical Society, vol. 45, Dec. 2004, pp. S564-S567.

International Search Report and Written Opinion issued on Jan. 17, 2013 for PCT Application No. PCT/US2012/043202.

International Search Report issued on Aug. 30, 2012 for PCT Application No. PCT/US2011/066780.

Non-Final Office Action issued on Jan. 31, 2014, to U.S. Appl. No. 13/528,901.

* cited by examiner

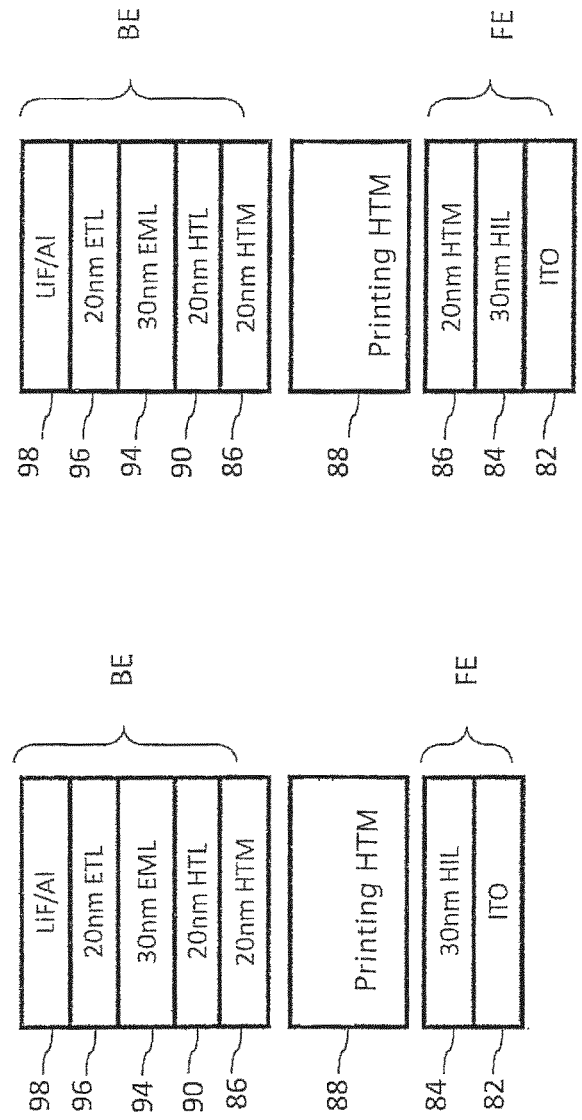

MATERIALS AND METHODS FOR ORGANIC LIGHT-EMITTING DEVICE MICROCAVITY

RELATED APPLICATIONS

The present application claims the benefit of U.S. patent application Ser. No. 13/333,867, filed Dec. 21, 2011, and Ser. No. 13/360,597, filed Jan. 27, 2012, and also claims priority to U.S. Provisional Patent Applications Nos. 61/499,465 and 61/499,496, both filed Jun. 21, 2011, all of which are incorporated herein in their entireties by reference.

FIELD

The present teachings relate to a process for forming layers of an organic light-emitting device (OLED). The present teachings also relate to an OLED stack structure.

BACKGROUND

OLEDs make use of thin organic films that emit light when voltage is applied across the device. OLEDs are becoming an increasingly interesting technology for use in applications such as flat panel displays, illumination, and backlighting. OLED technologies are discussed in Geffroy et al., "Organic light-emitting diode (OLED) technology: material devices and display technologies," Polym., Int., 55:572-582 (2006), and several OLED materials and configurations are described in U.S. Pat. Nos. 5,844,363, 6,303,238, and 5,707,745, which are incorporated herein by reference in their entireties.

In many cases, a large portion of light originating in an emissive layer within an OLED does not escape the device due to internal reflection at the air interface, edge emission, dissipation within the emissive or other layers, waveguide effects within the emissive layer or other layers of the device (i.e., transporting layers, injection layers, etc.), and other effects. In a typical OLED, up to 50-60% of light generated by the emissive layer can be trapped in a waveguide mode, and therefore fail to exit the device. Additionally, up to 20-30% of light emitted by the emissive material in a typical OLED can remain in a glass mode. The out-coupling efficiency of a typical OLED, thus, can be as low as about 20%. See, for example, U.S. Patent Application Publication No. US 2008/0238310 A1, which is incorporated herein by reference in its entirety.

Organic OLED layers, in a conventional process, are deposited by vacuum thermal evaporation (VTE). In such an OLED deposition process, organic layers are usually deposited at a slow deposition rate (from 1 Angstroms/second to 5 Angstroms/second) and the deposition time is undesirably long when a thick buffer layer is deposited. Moreover, to modify the layer thickness, a stencil mask is usually applied to either shield the vapor flux or allow it to pass through onto the substrate. Furthermore, the resulting organic layer usually has an index of refraction that is significantly higher than the index of refraction of the substrate glass. As such, some of the emitting light can be trapped in the organic layer and lost in a waveguide mode.

In vacuum thermal evaporation (VTE), a layer of hole transport material (HTM) is deposited in a vacuum at slow rate, for example, at about 0.2 nm/sec for 110 nm at a total time of about 550 seconds or about 9.0 minutes. No conventional technique, such as VTE, for forming organic thin films provides the large area patterning capabilities of inkjet printing or combines the capabilities of inkjet printing with the high uniformity, purity, and thickness control achieved with vapor deposition. It is desired to develop a technique that can offer both high film quality and cost-effective large area scalability.

SUMMARY

According to various embodiments, the present teachings relate to a deposition method to rapidly form a buffer layer between a light-emitting layer (EML) and an electrode during the manufacture of an OLED stack. The method can provide large scale fine patterning, an ultra-high deposition rate, and a post deposition heat-treatment method can be used to reduce the roughness of the buffer layer. The printing process, which uses inkjet printing and/or thermal printing provides capabilities to modify the morphology of the organic layer as well as its nanostructure, microstructure, electrical properties, and optical properties, therefore leading to improved OLED performance. The methods of the present teachings enable control of deposition conditions and manipulation of buffer layer morphology, structure, and properties. In some examples the method can provide a lowered charge injection barrier, a lowered index of refraction, an increased light outcoupling efficiency, and an increased interface area at a recombination zone where electron or hole charges recombine and photons are generated.

According to various embodiments, a porous buffer layer can be formed adjacent a transparent electrode. The buffer layer can exhibit a low index of refraction, comparable to a silica glass, enabling light extraction from the EML to be more efficient. In some embodiments, the buffer layer surface is made rough so that more light can be scattered or out-coupled into the transparent electrode layer. In some embodiments, the buffer layer is made crystalline to increase charge mobility, decrease voltage drop, and improve overall efficiency. In some embodiments, the buffer layer thickness is optimized for each color/wavelength to improve emission chromaticity and to achieve a microcavity effect. In some embodiments the buffer layer can be used to improve an OLED color chromaticity.

According to various embodiments, the buffer layer can be made by a method that combines a standard vacuum deposition technique (VTE) with an inkjet printing and/or thermal printing deposition technique. By changing the layer thickness, the emission spectrum can be tuned to be optimized for a certain color or wavelength; for example for red, green, or blue. In an exemplary embodiment, the buffer layer thickness can be made thickest for red, of intermediate thickness for green, and thinnest for blue. The method can be controlled such that a buffer layer printed at highly non-equilibrium rates can be made to have areas of very distinct nanostructure (dense versus porous, amorphous versus crystalline, and smooth versus rough).

According to various embodiments, a method of forming a dried organic layer for an organic light-emitting device is provided by the present teachings. In some embodiments the method can comprise the steps of applying, energizing, transferring, and baking. A liquid ink for forming a layer of an organic light-emitting device can be applied to a transfer surface. The liquid ink can be defined by a carrier fluid and dissolved or suspended, film-forming, organic material. The transfer surface can be energized to substantially evaporate the carrier fluid and form a dry film organic material on the transfer surface. The dry film organic material can be transferred from the transfer surface to a substrate such that the dry film organic material is deposited on the substrate in substantially a solid phase. Herein, such a process of applying, energizing, and transferring is referred to as thermal printing.

Thermal printing techniques and apparatuses that can be used include, for example, those described in U.S. Patent Application Publications Nos. US 2008/0311307 A1, US 2008/0308037 A1, US 2006/0115585 A1, US 2010/0188457 A1, US 2011/0008541 A1, US 2010/0171780 A1, and US 2010/0201749 A1, which are all incorporated herein in their entireties by reference. In some embodiments, the transfer surface can be positioned at a distance of from about 1.0 μm to about 10.0 mm from the substrate during the transferring, for example, at a distance of from about 10.0 μm to about 100.0 μm from the substrate. The dry film organic material can be deposited to build up a layer thickness at a rate of from about 0.1 nm/sec to about 1.0 mm/sec, to form an organic layer on the substrate. In some embodiments the organic layer can be baked at a first bake temperature of from about 50° C. to about 250° C. for a first bake time of from about 5.0 milliseconds to about 5.0 hours to form a first baked organic layer for an organic light-emitting device.

In some embodiments, liquid ink is transferred directly to the substrate or organic layer using inkjet printing. Following application of the liquid ink to the substrate, the carrier can be driven off with heat, vacuum, a gas stream, radiation exposure, or a combination thereof, to form an organic layer that can be baked as described above with reference to thermal printing processes. For this method and other methods described herein, liquid ink can be transferred, using one or more pass of an inkjet printhead, to a particular location on a substrate thus forming an organic layer. Subsequent passes by the inkjet printhead can be used to build up layer thicknesses. Subsequent passes can be configured to transfer inkjet ink onto smaller areas of the relative to the areas where a previous pass deposited the ink. Printing on smaller areas can be used to prevent spill-over, running, and blurring of inkjet ink as might occur if the exact same area is attempted to be covered by a second pass as was covered by a first pass. Carriers, for example, solvents, for a particular liquid ink can be chosen that will not substantially dissolve or suspend organic material in an underlying layer that has already been deposited. In some cases different carriers or solvents can be used that provide different relative solubilities for the same organic material.

A method of forming a crystalline organic layer for an organic light-emitting device is provided by the present teachings. In some embodiments, the method can comprise at least an inkjet printing step followed by a baking step. In some embodiments, the method can comprise an applying step, an energizing step, a transferring step, and a baking step, for example, a thermal printing step followed by a baking step. If a thermal printing step is used, a liquid ink can be applied to a transfer surface to form a layer of an organic light-emitting device. The liquid ink can be defined by a carrier fluid and dissolved or suspended, film-forming, organic material. The film-forming organic material can comprise a material that exhibits desired properties for a layer of an OLED. The transfer surface can be energized to substantially evaporate the carrier fluid and form a dry film organic material on the transfer surface. The dry film organic material can have a glass transition range. The dry film organic material can be transferred from the transfer surface to a substrate such that the dry film organic material is deposited on the substrate in substantially a solid phase. The transfer surface can be positioned at a distance of from about 1.0 μm to about 10.0 mm from the substrate during the transferring, for example, at a distance of from about 10.0 μm to about 100.0 μm from the substrate. The dry film organic material can be deposited to build up a layer thickness at a rate of from about 0.1 nm/sec to about 1.0 mm/sec, to form a pre-bake organic layer on the substrate. The pre-bake organic layer can be baked at a bake temperature of from within the glass transition range to above the glass transition range, to thus form a crystalline organic layer for an organic light-emitting device. The crystalline organic layer can have a conductivity of from about $1.0\times10^{-9}$ S/m to about $1.0\times10^{-1}$ S/m, for example, from about $1.0\times10^{-9}$ S/m to about $1.0\times10^{-4}$ S/m, or from about $1.0\times10^{-9}$ S/m to about $1.0\times10^{-7}$ S/m. Higher conductive HTM layer materials can be used to achieve higher conductivities.

In some embodiments, a crystalline organic layer for an organic light-emitting device is formed by transferring liquid ink directly to the substrate, or directly to an existing organic layer, by using inkjet printing. Following application of the liquid ink to the substrate, the carrier can be driven off with heat, vacuum, a gas stream, radiation exposure, or a combination thereof. The dried organic layer can then be baked to form a crystalline structure as described above with reference to the thermal printing process. The distances, deposition rates, and conductivities mentioned above with reference to the thermal printing techniques can likewise be used and achieved to form similar layers using inkjet printing.

An organic light-emitting device is also provided in accordance with the present teachings. The device can comprise a first electrode, a crystalline organic layer, an emitting layer, and a second electrode. The crystalline organic layer can be provided over and electrically associated with the first electrode and can have a conductivity of from about $1.0\times10^{-9}$ S/m to about $1.0\times10^{-7}$ S/m. The emitting layer can be provided adjacent, and electrically associated with, the crystalline organic layer and can comprise a light-emitting organic material that emits light at an emission wavelength. The second electrode can be provided over and electrically associated with the emitting layer such that the emitting layer is sandwiched between the first and second electrodes.

A method of decreasing the refractive index of an organic layer is provided in accordance with yet further embodiments of the present teachings. The method can comprise an inkjet printing step or printing that combines an applying step, an energizing step, and a transferring step. The printing can be repeated for multiple applications of various liquid inks, comprising respectively different dissolved or suspended film-forming organic material. If thermal printing is used, each liquid ink can be applied to a transfer surface for forming a respective layer of an organic light-emitting device. The transfer surface can be energized to substantially evaporate the carrier fluid and form a dry film organic material on the transfer surface. The dry film organic material can then be transferred from the transfer surface to a semi-transparent or translucent electrode disposed on a semi-transparent or translucent substrate such that the dry film organic material is deposited on the semi-transparent or translucent electrode in substantially a solid phase. The transfer surface can be positioned at a distance of from about 1.0 μm to about 10.0 mm from the substrate during the transferring, for example, at a distance of from about 10.0 μm to about 100.0 μm from the substrate. The dry film organic material can be deposited to build up a layer thickness at a rate of less than about 100 nm/sec, to form a first organic layer. A second liquid ink can be applied to a second transfer surface, the second liquid ink defined by a carrier fluid and dissolved or suspended film-forming organic material for forming a layer of an organic light-emitting device. The second transfer surface can be energized to substantially evaporate the carrier fluid and form a second dry film organic material on the second transfer surface. The second dry film organic material can be transferred from the second transfer surface to the first organic layer such that the second dry film organic material is deposited in substantially a solid phase. The dry film organic material can be deposited to build up a layer thickness at a rate of from about 0.1 nm/sec to about 1.0 mm/sec, to form a second organic layer. The index of refraction of the first organic layer can be intermediate between an index of refraction of the semi-transparent or translucent substrate and an index of refraction of the second organic layer. In some embodiments, liquid ink is transferred directly to the substrate or organic layer using inkjet printing. Following application of the liquid ink to the substrate, the carrier can be driven off with heat, vacuum, a gas stream, radiation, or a combination thereof, to form an organic layer that can be baked as described above with reference to the thermal printing process. The distances, deposition rates, and indices of refraction mentioned above with reference to the thermal printing techniques can likewise be used in conjunction with inkjet printing techniques.

A method of increasing light scattering in an organic light-emitting device is also according to various embodiments of the present teachings. The method can comprise an inkjet printing step or a combination of an applying step, an energizing step, and a transferring step. If a thermal printing technique is used, a liquid ink can be applied to a transfer surface. The liquid ink can be defined by a carrier fluid and dissolved or suspended, film-forming, organic material. The transfer surface can be energized to substantially evaporate the carrier fluid and form a dry film organic material on the transfer surface. The dry film organic material can then be transferred from the transfer surface to a substrate such that the dry film organic material is deposited on the substrate in substantially a solid phase, wherein the transfer surface is positioned at a distance of less than about 200 µm from the substrate. The transferred organic film material can be deposited to build up a layer thickness at a rate of from about 0.1 nm/sec to about 1.0 mm/sec and at a mass deposition rate of from about 1.0 ng/sec to about 100 µg/sec, to form a multi-layered rough organic layer. The multi-layered rough organic layer can comprise from about 2 sub-layers to about 200 sub-layers and have a roughness of from about 5.0 nm to about 10.0 nm as the root mean squared of surface thickness deviations in an area 100 µm². In some embodiments, the area measured is a 10 µm by 10 µm surface. For example, the multi-layered rough organic layer can comprise from about 2 sub-layers to about 100 sub-layers, or from about 2 sub-layers to about 200 sub-layers. An emitting material can be deposited over the multi-layered rough organic layer to form an emitting layer and at least part of an organic light-emitting device stack. An organic light-emitting device stack including the multilayered rough organic layer and the emitting layer can exhibit a luminosity efficiency of from about 1.01 to about 2.0, that is, the organic light-emitting device stack can exhibit an increase in luminosity by a factor of from about 1.01 to about 2.0 relative to the luminosity of the same microcavity but wherein the second surface has a surface roughness of less than 5.0 nm, expressed as the root mean square of the surface thickness deviation in an area of 10×10 µm².

In some embodiments for increasing light scattering, liquid ink is transferred directly to the substrate or organic layer using inkjet printing. Following application of the liquid ink to the substrate, the carrier can be driven off with heat, vacuum, a gas stream, radiation exposure, or a combination thereof, to form an organic layer that can optionally be baked. The same distances, thickness build-up rates, mass deposition rates, surface roughness, number of layers, and luminosity efficiencies can be used for inkjet printing techniques as are described above with reference to the thermal printing process.

An organic light-emitting device stack is also provided by embodiments of the present teachings. The stack can comprise a substrate and a dry film organic material layer formed on the substrate. The dry film organic layer can comprise from about 2 sub-layers to about 20 sub-layers, a first surface facing the substrate, and a second surface opposite the first surface. The stack can comprise an emitting layer formed over the dry film organic material layer such that the dry film organic material layer is between the substrate and the emitting layer. The emitting layer can comprise a light-emitting organic material that emits light, upon excitation, at a particular emission wavelength, for example, a peak wavelength. The second surface can exhibit a surface roughness of from about 0.5 nm to about 1.0 µm as the root mean squared of surface thickness deviations in an area 10 µm², for example, from about 1.0 nm to about 10.0 nm as the root mean squared of surface thickness deviations in an area 10 µm². In some embodiments, the area measured is a 10 µm by 10 µm surface. The organic light-emitting device stack can exhibit an increase in luminosity of a factor of from about 1.01 to about 2.0 relative to the luminosity of the same microcavity but with a second surface having surface roughness of less than 5.0 nm expressed as the root mean square of the surface thickness deviation in an area of 10×10 µm².

In some embodiments, a method of forming a microcavity for an organic light-emitting device is provided. The method can comprise an inkjet printing step or a combination of an applying step, an energizing step, and a transferring step. If a thermal printing technique is used, a liquid ink can be applied to a transfer surface. The liquid ink can be defined by a carrier fluid and a dissolved or suspended film-forming organic material. The transfer surface can be energized to substantially evaporate the carrier fluid and form a dry film organic material on the transfer surface. The dry film organic material can be transferred from the transfer surface to a substrate such that the dry film organic material is deposited on the substrate in substantially a solid phase, to form a first organic buffer layer. The substrate can comprise a first reflective electrode and the transfer surface can be positioned at a distance of from about 1.0 µm to about 10.0 mm from the substrate during the transferring, for example, at a distance of from about 10.0 µm to about 100.0 µm from the substrate. The dry film organic material can be deposited to build up a layer thickness at a rate of from about 0.1 nm/sec to about 500 nm/sec, for example, at a rate of from about 0.1 nm/sec to about 50 nm/sec. A light-emitting organic material can be deposited over the first organic buffer layer to form an emitting layer such that the first organic buffer layer is between the substrate and the emitting layer. A second reflective electrode can be deposited over the emitting layer such that the emitting layer is between the first reflective electrode and the second reflective electrode, to form an OLED microcavity. At least one of the first and second reflective electrodes can be semi-transparent or translucent and the first reflective electrode and the second reflective electrode can be separated from one another by a distance. The distance can correspond to a depth of the microcavity. The depth of the microcavity can be configured for resonance emission of the emission wavelength of the light-emitting organic material.

In some embodiments, the method of forming a microcavity comprises transferring liquid ink directly to the substrate or to an existing organic layer by using inkjet printing. Following application of the liquid ink to the substrate, the carrier can be driven off with heat, vacuum, a gas stream, radiation exposure, or a combination thereof, to form an organic layer that can be baked as described herein with reference to the thermal printing processes.

In yet other embodiments of the present teachings, a microcavity for an organic light-emitting device is provided. The microcavity can comprise a substrate, a dry film organic material layer, an emitting layer, and a second reflective electrode. The substrate can comprise a first reflective electrode. The dry film organic material layer can be formed on the substrate and comprise a first surface facing the substrate and a second surface opposite the first surface. An emitting layer over the dry film organic material layer can be provided such that the dry film organic material layer is disposed between the first reflective electrode and the emitting layer. The emitting layer can comprise a light-emitting organic material. The second reflective electrode can be provided over the emitting layer such that the emitting layer is disposed between the first reflective electrode and the second reflective electrode. The second surface can exhibit a surface roughness of from about 0.5 nm to about 1.0 µm as the root mean squared of surface thickness deviations in an area 10×10 µm², for example, a surface roughness of from about 0.5 nm to about 10.0 nm, of from about 1.0 nm to about 1.0 µm, of from about 5.0 nm to about 1.0 µm, or of from about 10.0 nm to about 500 nm. In some embodiments, the area measured is a 10 µm by 10 µm surface. The organic light-emitting device stack can exhibit an increase in luminosity of a factor of from about 1.01 to about 2.0 relative to the luminosity of the same microcavity but with a second surface having surface roughness of less than 5.0 nm expressed as the root mean square of the surface thickness deviation in an area of 10×10 µm². The rough surface interface can be used to separate the microcavity effect such that color chromaticity is enhanced from the light outcoupling effect and thus luminosity efficiency is enhanced. At least one of the first and second reflective electrodes can be semi-transparent or translucent. The first reflective electrode and the second reflective electrode can be separated from one another by a distance, the distance can correspond to a depth of the microcavity, and the depth of the microcavity can be configured for resonance emission of the emission wavelength of the light-emitting organic material.

BRIEF DESCRIPTION OF THE DRAWINGS

A better understanding of the features and advantages of the present teaching is provided with reference to the accompanying drawings, which are intended to illustrate, not limit, the present teachings. Where the term "printing" is used in these drawings, inkjet printing, thermal printing, or both, are intended to be encompassed unless otherwise specified.

FIGS. 2A-2D are schematic drawings of device stacks with layer deposition sequences in accordance with various embodiments of the present teachings.

DETAILED DESCRIPTION

Figure 1:
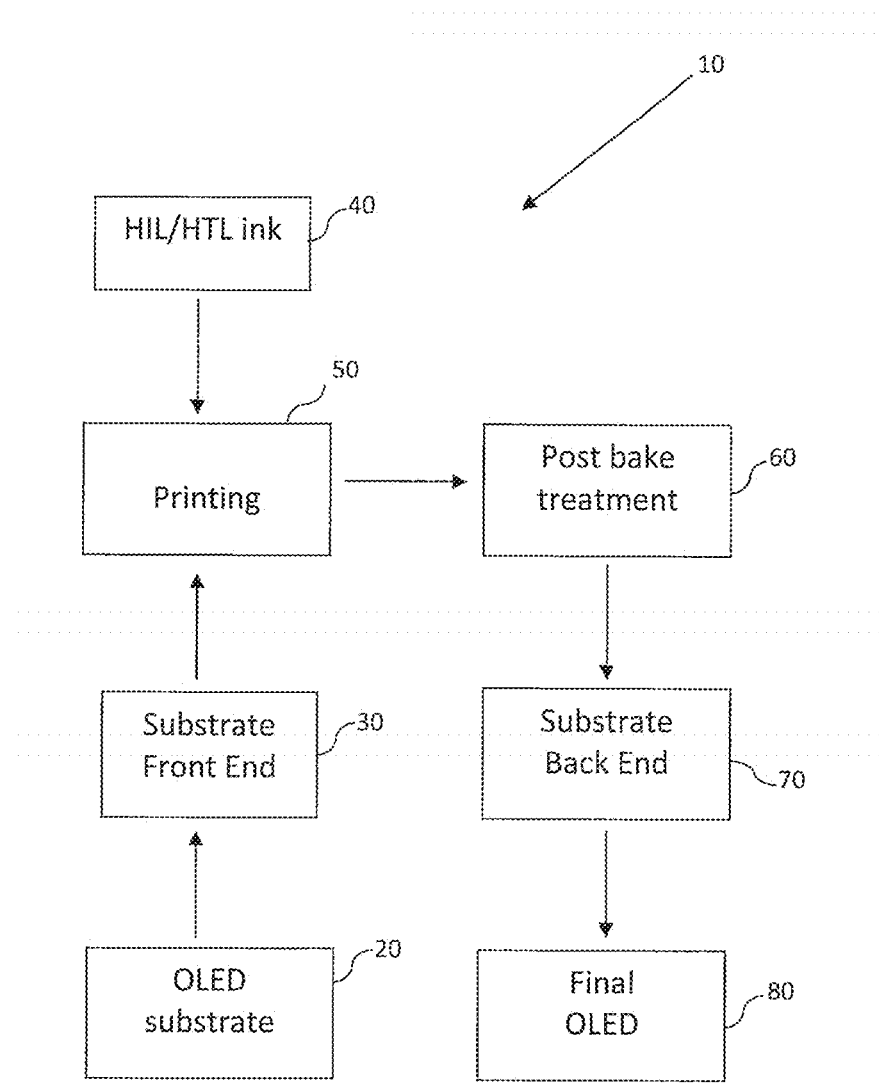
FIG. 1 is a flow chart showing a process flow in accordance with various embodiments of the present teachings.

According to various embodiments, an OLED is formed that comprises at least one organic layer disposed between, and in electrical connection with, an anode and a cathode. When a current is applied, the anode injects holes, and the cathode injects electrons, into the organic layer. The injected holes and electrons respectively migrate toward the oppositely charged electrode. When an electron and hole localize on the same molecule in the organic layer, an "exciton" is formed that comprises a localized electron-hole pair having an excited energy state. Light is emitted when the exciton relaxes via a photoemissive mechanism.

The methods can comprise forming various layers, including buffer layers, to control the properties of the OLED device or of other organic multi-layered light-generating structures. For example, a buffer layer or other layer can be formed and included in a device, which comprises at least one of a hole injection layer (HIL), a hole transport layer (HTL), an emission layer (EML), an electron transport layer (ETL), an electron injection layer (EIL), and a blocking layer (BL). Other layers, such as a protective layer, can also be formed and/or incorporated into the resulting device. One or more parameters such as ink concentration, deposition (accumulation) rate, mass deposition rate, bake temperature, and/or bake time, as described herein, can be employed and/or adjusted so that a first baked organic layer, buffer layer, or any other layer can be provided with desired characteristics to make the layer suitable for one or more OLED applications.

Inkjet printing, thermal printing, or both can be used to form one or more of the layers and can be controlled by adjusting one or more of many parameters. The parameters can be tuned to change the organic layer structure and roughness and to create unique features in the organic layer. By controlling inkjet printing and/or thermal printing conditions the structure and properties of the organic layer can be tailored such that one or more aspects of OLED performance can be enhanced. The film deposition process can involve accumulation of film material on the substrate whereby the deposited material first deposits at a molecular level, then forms clusters. The clusters can then grow in size to become islands, and then coalesce to finally form a continuous film. For typical organic materials that have low packing densities and strong bonding directionality they can be deposited in an amorphous state. Under the influence of thermal radiation or in the presence of solvent vapor, the organic molecules can undergo surface migration, rearrangement, and/or relaxation during film growth, which, as a consequence, can lead to the growth of columnar or crystalline structures, especially at high deposition rates. Further, if the film undergoes heat treatment and the viscosity is low enough that the surface tension overcomes the internal friction, then the film can start to reflow. If the film is not properly compatible with the underlying substrate, it can start to pull up and dewet from the substrate, and as a result can form a distinct surface pattern, for example, by spinodal decomposition. In some cases, the inkjet printed and/or thermal printed films of the present teachings can, for example, act as a seed layer or a buffer layer to provide a cushion for the deposition of other layers. In some cases, the other layers can comprise the remaining layers of an OLED stack. Combining inkjet printing and/or thermal printing with a post-deposition heat treatment can be used to create distinctive surface patterns on a micro- or nano-scale. The layer thickness can be changed or surface roughness of the organic layer can be changed and such changes can be implemented to enhance features such as luminosity efficiency.

With reference to the drawings, FIG. 1 is a flow chart showing a process flow 10 in accordance with various embodiments of the present teachings. An OLED substrate 20 can be provided as part of a substrate front end 30. HIL/HTL ink 40 can be applied to OLED substrate 20 using inkjet printing or thermal printing 50 to build a substrate front end 30. The substrate front end 30, after ink transfer, can be subjected to a post-bake treatment 60. A substrate back end 70 can then be constructed on the completed front end such that a final OLED 80 can be formed.

Figures 2A, 2B:
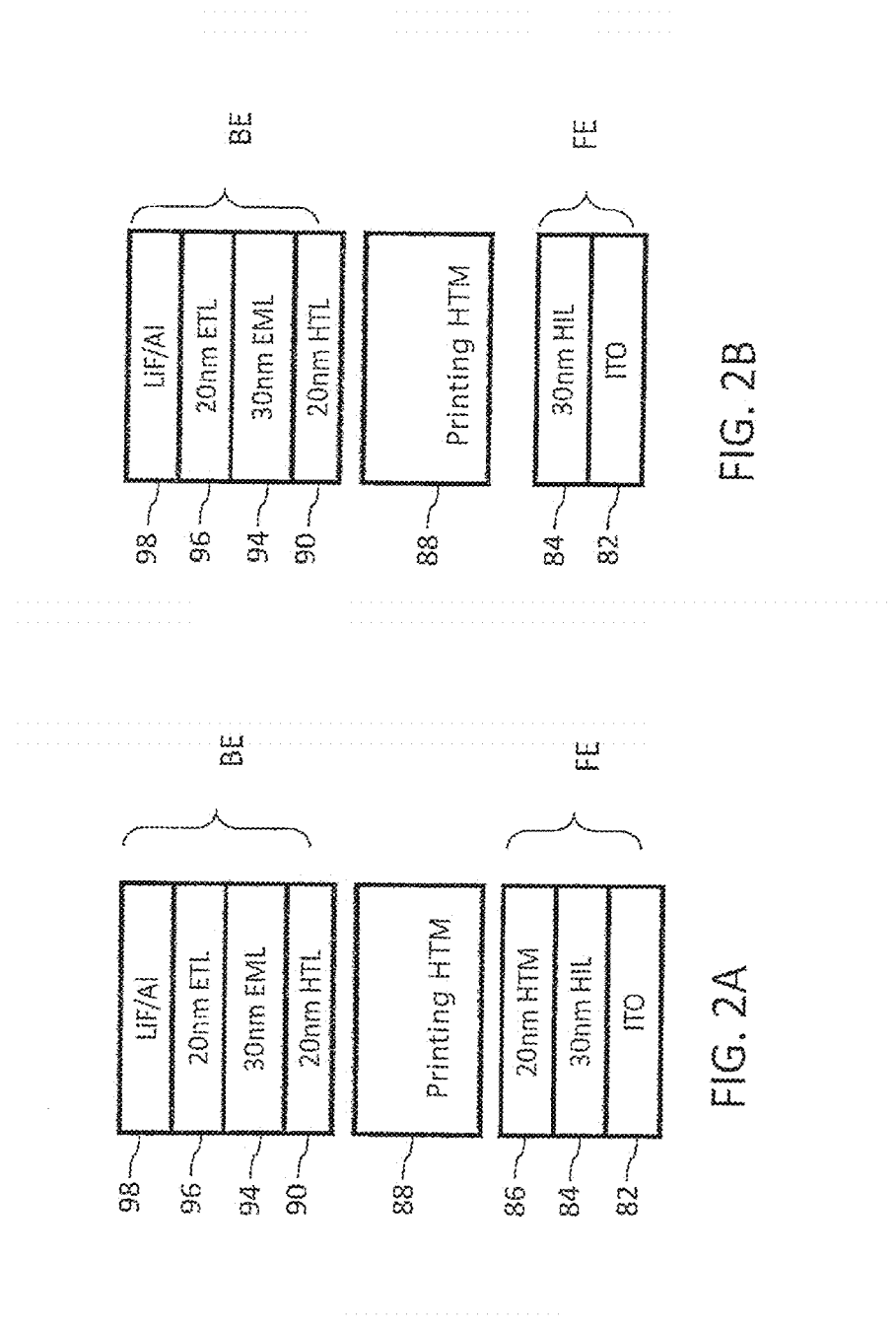

With reference to the remaining drawings, identical reference numbers used in different drawings denote the same layer materials and thicknesses as described in connection with the other drawings. FIGS. 2A-2D are schematic drawings of device stacks with layer deposition sequences formed in accordance with the present teachings. The stacks each have a front end (FE), an intervening inkjet printed or thermal printed hole transport material (HTM) layer 88, and a back end (BE). FIG. 2A is a schematic representation of an OLED stack that can be fabricated in accordance with various embodiments of the present teachings. The front end of the stack can comprise an anode 82, an HIL 84, and an HTM layer 86. The back end of the stack can comprise an HTL 90, an EML 94, an ETL 96, and a cathode 98. Additional layers, substitute layers, or different arrangements of layers can also be used. Anode 82 can comprise, for example, indium tin oxide (ITO). HIL 84 can be of any suitable thickness, for example, from 10 nm to 50 nm thick, or 30 nm thick, and can comprise, for example, the materials described in U.S. Patent Application Publication No. US 2011/0057171 A1, which is incorporated herein in its entirety by reference. HTM layer 86 can be of any suitable thickness, for example, from 10 nm to 30 nm thick, or 20 nm thick, and can comprise the material, for example, of formula 2 shown in U.S. Patent Application Publication No. US 2007/0134512 A1, which is incorporated herein in its entirety by reference. HTL 90 can be of any suitable thickness, for example, from 10 nm to 30 nm thick, or 20 nm thick, and can comprise NPB. EML 94 can be of any suitable thickness, for example, from 10 nm to 50 nm thick, or 30 nm thick. ETL 96 can be of any suitable thickness, for example, from 10 nm to 30 nm thick, or 20 nm thick, and can comprise the materials described, for example, in U.S. Patent Application Publication No. US 2009/0167162 A1, which is incorporated herein in its entirety by reference. Cathode 98 can comprise lithium fluoride and/or aluminum.

FIG. 2B is a schematic representation of another OLED stack according to the present teachings. The front end (FE) of the stack can comprise anode 82 and HIL 84. The back end (BE) of the stack can comprise HTL 90, EML 94, ETL 96, and cathode 98. The thicknesses of the various layers can be the same as those described in connection with FIG. 2A.

FIG. 2C is a schematic representation of yet another stack according to various embodiments of the present teachings. The front end (FE) of the stack can comprise anode 82 and HIL 84. The back end (BE) of the stack can comprise HTM layer 86, HTL 90, EML 94, ETL 96, and cathode 98. The thicknesses of the various layers can be the same as those described in connection with FIG. 2A.

FIG. 2D is a schematic representation of yet another stack according to various embodiments of the present teachings. The front end (FE) of the stack can comprise anode 82, HIL 84, and HTM layer 86. The back end (BE) of the stack can comprise another HTM layer 86, HTL 90, EML 94, ETL 96, and cathode 98. The thicknesses of the various layers can be the same as those described in connection with FIG. 2A.

The inkjet printing or thermal printing methods of the present teachings enable film thickness to be modified by changing any of a number of parameters. For example, the method can involve using a specific organic material concentration in the liquid ink, a specific print pitch, a specific number of ink drops per pixel, a specific ink drop volume, and/or specific evaporation conditions (e.g., pressure, temperature, and duration). The ink preparation for depositing an HIL or HTL can take into consideration the specific EML ink that will subsequently be used. The "front end" (FE) refers to those layers deposited, and steps conducted, before inkjet printing or thermal printing. The OLED front end process can include substrate chemical cleaning, rinsing, baking, UV ozone treatment, oxygen plasma cleaning, and coating the HIL or HTL by VTE or other deposition methods. The "back-end process" (BE) can include coating the HIL or the HTL by VTE, depositing the EML, depositing the ETL, and forming an electrode. Depending on whether the process begins with the anode or the cathode, the layers associated with the FE or BE can be reversed. Examples of some FE and BE processes in accordance with the present teachings are shown in FIG. 3.

Figure 3:
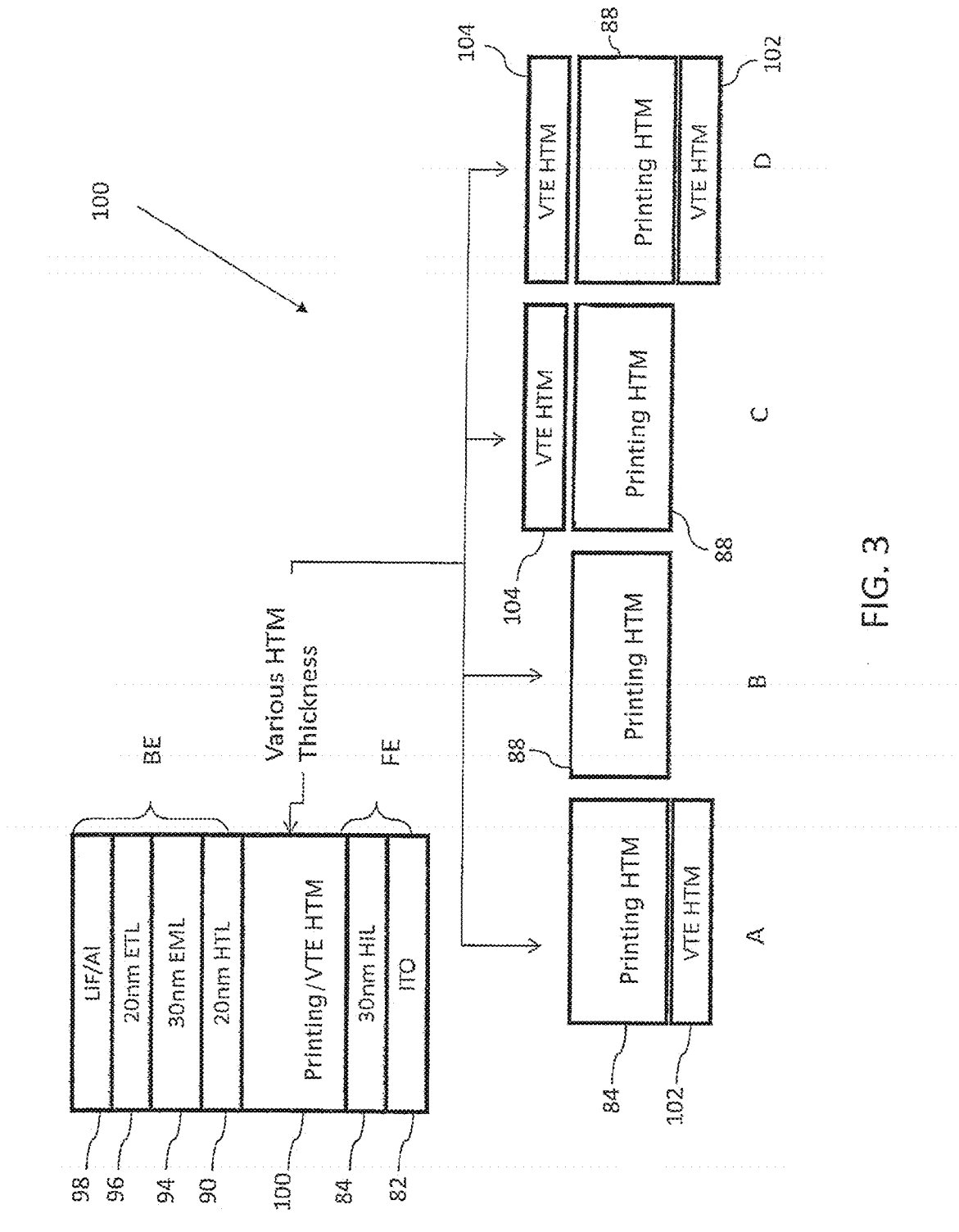
FIG. 3 is a schematic drawing illustrating a VTE process, a thermal printing process, an inkjet printing process, or a combination thereof, that can be used to vary HTM layer thickness and to tune a device emission spectrum, in accordance with various embodiments of the present teachings.

FIG. 3 is a schematic drawing illustrating FE and BE layers and various deposition techniques and combinations of deposition techniques that can be used to form an HTM layer. As can be seen, a VTE process, a thermal printing process, an inkjet printing process, or a combination thereof, can be used to form different HTM layers, for example, of varying thickness. The deposition techniques can be tailored to tune a device emission spectrum, in accordance with the present teachings. An OLED stack is shown that comprises anode 82 and HIL 84 on the front end (FE). The HTM layer 100 is located between the front end and the back end and can be deposited by thermal printing, inkjet printing, VTE, or a combination thereof. The back end can comprise HTL 90, EML 94, ETL 96, and cathode 98. Four different embodiments of HTM layer 100 are shown. Embodiment A comprises forming a VTE-HTM layer 102 followed by an inkjet printed or thermal printed HTM layer 88. Embodiment B comprises forming HTM layer 88 by inkjet printing or thermal printing alone. Embodiment C comprises forming HTM layer 88 by an inkjet printing or thermal printing, in combination with forming a VTE-HTM layer 104. Embodiment D comprises forming a first VTE-HTM layer 102, forming HTM layer 88 by inkjet printing or thermal printing, and forming a second VTE-HTM layer 104, in that order or in another order.

Figure 4:
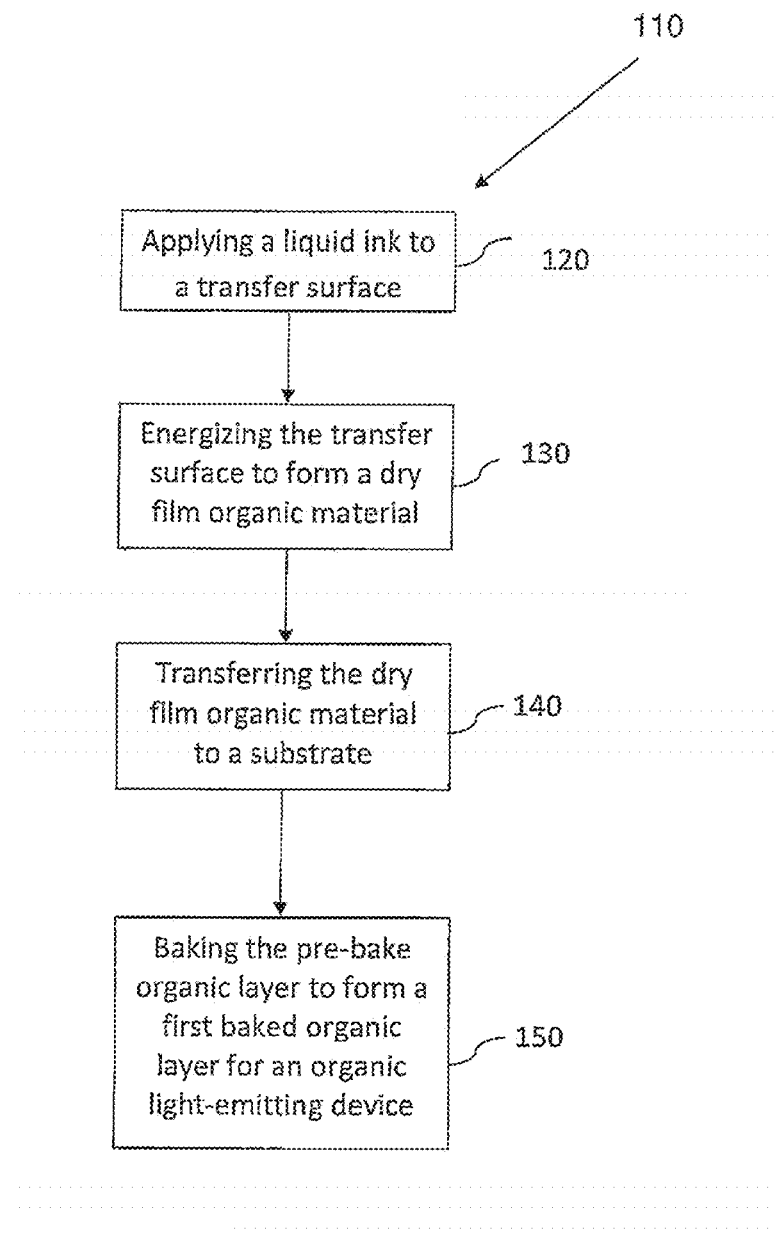
FIG. 4 is a flow diagram of a method of forming a dried organic layer for an organic light-emitting device, in accordance with various embodiments of the present teachings.

FIG. 4 illustrates a thermal printing method of forming a dried organic layer for an organic light-emitting device, provided by the present teachings. The method can comprise applying, energizing, transferring, and baking steps. For example, FIG. 4 is a flow diagram of a method 110 of forming a dried organic layer for an organic light-emitting device in accordance with the present teachings. An applying step 120 is shown followed by an energizing step 130, a transferring step 140, and a baking step 150.

A liquid ink can first be applied to a transfer surface for forming a layer of an organic light-emitting device. The liquid ink can be defined by a carrier fluid and dissolved or suspended film-forming organic material. The transfer surface can then be energized to substantially evaporate the carrier fluid and form a dry film organic material on the transfer surface. The dry film organic material can then be transferred from the transfer surface to a substrate such that the dry film organic material is deposited on the substrate in substantially a solid phase. The transfer surface can be positioned at a distance of from about 1.0 µm to about 50.0 mm from the substrate during the transferring, for example, at a distance of from about 10.0 µm to about 100.0 µm from the substrate. The dry film organic material can be deposited to build up a layer thickness at a rate of from about 0.1 nm/sec to about 1.0 mm/sec, to form a pre-bake organic layer on the substrate. The pre-bake organic layer can be baked at a first bake temperature of from about 50° C. to about 250° C. for a first bake time of from about 5.0 milliseconds to about 5.0 hours to form a first baked organic layer for an organic light-emitting device.

Any type of transfer surface or combination of transfer surface types can be employed with the methods of the present teachings. Examples of transfer surface types can include nozzles, flat surfaces, and channels. Any number of transfer surfaces can be employed, and any particular transfer surface can comprise one or more opening for ejecting or otherwise transferring ink, organic material, or other kinds of material. The organic material can comprise one or more type of organic molecule. While "organic material" as described herein includes at least one kind of organic material, the organic material can also include impurities of an inorganic nature, or small amounts of inorganic material.

The transferring step can comprise transferring the organic material onto a substrate. The transfer surface can be positioned at any desired distance from substrate during the deposition of the at least one organic material, and the distance chosen can be utilized to provide desired characteristics to the deposited organic layer. The distance between the transfer surface and the substrate can be, for example, from about 1.0 µm to about 500 mm, from about 20 µm to about 10 mm, from about 30 µm to about 2.0 mm, from about 10.0 µm to about 100.0 µm, from about 40 µm to about 60 µm, or about 50 µm. These distances can also be used in embodiments that do not include a baking step.

In some embodiments an inkjet printing technique is used for the depositing step instead of a thermal printing technique. Whether inkjet printing or thermal printing is used, a pre-bake organic layer can be formed and then further processed as described below.

The at least one organic material being deposited during the depositing step can build up a layer thickness at any desired rate to form a pre-bake organic layer. For example, the layer thickness can be built up at a rate of from about 0.1 nm/sec to about 1.0 mm/sec, from about 0.5 nm/sec to about 750 µm/sec, from about 1.0 nm/sec to about 600 µm/sec, from about 5.0 nm/sec to about 500 µm/sec, from about 10 nm/sec to about 400 µm/sec, from about 25 nm/sec to about 250 µm/sec, from about 50 nm/sec to about 100 µm/sec, from about 100 nm/sec to about 1.0 µm/sec, from about 150 nm/sec to about 750 nm/sec, or from about 250 nm/sec to about 500 nm/sec.

The pre-bake organic layer, or any other organic layer deposited can be baked at any desired temperature for any desired duration. Preferably the layer is baked at a temperature of at least the glass transition temperature of the organic material transferred. The bake temperature can be from about 30° C. to about 450° C., from about 40° C. to about 400° C., from about 45° C. to about 300° C., from about 50° C. to about 250° C., from about 55° C. to about 235° C., from about 60° C. to about 220° C., from about 70° C. to about 205° C., from about 80° C. to about 180° C., or from about 100° C. to about 160° C.

The bake time duration, or the difference in bake time duration between two different bake times, can be from about 5.0 milliseconds to about 5.0 hours, from about 10 milliseconds to about 2.5 hours, from about 50 milliseconds to about 1.5 hours, from about 100 milliseconds to about 1.0 hour, from about 250 milliseconds to about 30 minutes, from about 500 milliseconds to about 15 minutes, from about 1.0 second to about 10 minutes, from about 5.0 seconds to about 2.5 minutes, from about 10 seconds to about 1.0 minute, from about 15 seconds to about 50 seconds, or from about 20 seconds to about 45 seconds. For example, the baking can heat the substrate to an elevated temperature and hold it for a period of time, for example, about 3 minutes at from about 150° C. to about 180° C. The temperature can be close to or above the glass transition temperature of the HIL or HTL organic material to enable the organic material to reflow or rearrange, thus minimizing the surface roughness. The bake temperature and time can be set so as to not exceed a certain limit such that the layer is prevented from crystallizing or re-evaporating.

The method can be performed any desired number of times to form any desired number of layers. If multiple baked organic layers are formed, the bake temperature of each subsequent layer should be less than the bake temperature used for baking the previously baked layer or layers. That is, if it is desired to heat to the glass transition temperature from each layer, the glass transition temperature of each subsequently baked layer should be less that the glass transition temperature of any proceeding baked layer so as to prevent or minimize the movement or alteration of the previously baked layers. The difference in bake temperature and/or glass transition temperature of two sequentially deposited layers can be from about 1.0° C. to about 500° C., from about 15° C. to about 250° C., from about 20° C. to about 100° C., from about 25° C. to about 75° C., from about 40° C. to about 70° C., or from about 45° C. to about 65° C. For example, the bake temperature for a first organic layer can be from about 50° C. to about 250° C., the bake temperature for a second organic layer can be from about 50° C. to about 235° C., but less that that used for the first layer, the bake temperature for a third organic layer can be from about 50° C. to about 220° C., but less that that used for the second layer, and so on. In some embodiments, a particular organic layer can be baked at one or more temperature. The bake time duration for subsequent layers can be the same as or less that the bake time of the previous layer. For example, a second bake time can be less than a first bake time, a third bake time can be less than a second bake time, a fourth bake time can be less than a third bake time, and a fifth bake time can be less than a fourth bake time.

As described in more detail herein, one or more parameters, such as ink concentration, deposition (transfer/accumulation) rate, mass deposition rate, bake temperature, and/or bake time, can be employed and/or varied to produce organic layers with particular, desired characteristic. For example, at least one of the deposition rate and bake time can be adjusted so that the organic layer has a crystalline character. Employing a faster deposition (transfer accumulation) rate, baking at a higher temperature, and/or baking for a longer bake time can aid in achieving a crystalline layer. At least one of the deposition rate and bake time can be adjusted so that the organic layer has a porous character. In some embodiments, a fast deposition rate, a low bake temperature, and/or a short bake time can help yield a porous layer. A higher mass deposition rate, a low bake temperature, and/or a short bake time can be used to produce a rough layer. At least one of the deposition rate and bake time can be adjusted so that the baked layer has a rough character.

Figure 5:
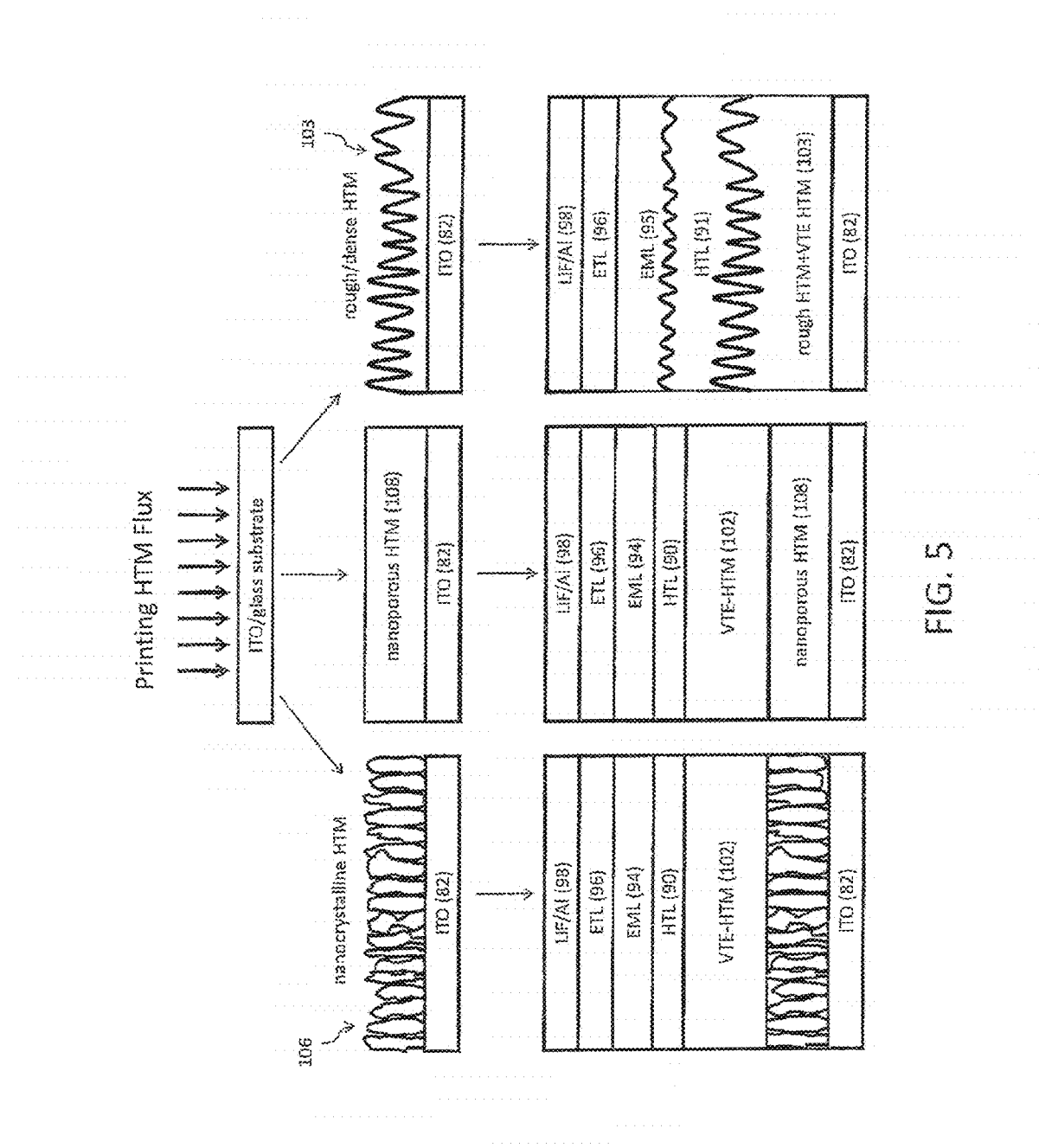
FIG. 5 is a schematic drawing illustrating three different film morphologies formed under various deposition conditions in accordance with various embodiments the present teachings.

FIG. 5 is a schematic drawing illustrating three different film morphologies formed under various deposition conditions in accordance with various embodiments of the present teachings. Hole transport material (HTM) can be deposited by inkjet printing flux or by thermal printing flux to an anode 82 that can comprise indium tin oxide layered on a glass substrate. In the stack shown on the left-side of the figure, an inkjet printed or thermal printed HTM layer 106 having a nanocrystalline morphology is shown formed on anode 82 and covered by VTE-HTM layer 102, HTL 90, EML 94, ETL 96, and cathode 98. In the stack shown in the middle of the figure an inkjet printed or thermal printed HTM layer 108 having a nanoporous morphology is shown on anode 82, followed by VTE-HTM layer 102, HTL 90, EML 94, ETL 96, and cathode 98. In the stack shown on the right-side of the figure a rough/dense HTM layer 103 is shown on anode 82, followed by HTL 91, EML 95, ETL 96, and cathode 98.

The transfer rate of the organic material transferred from the transfer surface can be adjusted, for example, in terms of the mass of organic material ejected over a particular period of time. The mass transfer rate can be from about 0.5 ng/sec to about 500 µg/sec, from about 1.0 ng/sec to about 100 µg/sec, from about 5.0 ng/sec to about 80 µg/sec, from about 15 ng/sec to about 10 µg/sec, from about 50 ng/sec to about 1 µg/sec, from about 100 ng/sec to about 500 ng/sec, or from about 200 ng/sec to about 400 ng/sec.

An organic layer can be formed of any desired thickness. The organic layer can have a thickness of from about 0.5 nm to about 100 µm, from about 1.0 nm to about 50 µm, from about 10 nm to about 10 µm, from about 20 nm to about 1.0 µm, from about 50 nm to about 500 nm, or from about 100 nm to about 300 nm.

Any of the organic layers can be formed of any desired density. The organic layer can have a density of from about 0.1 g/cm$^3$ to about 7.5 g/cm$^3$, from about 0.25 g/cm$^3$ to about 5.0 g/cm$^3$, from about 0.5 g/cm$^3$ to about 2.5 g/cm$^3$, from about 1.0 g/cm$^3$ to about 2.0 g/cm$^3$, or from about 1.25 g/cm$^3$ to about 1.5 g/cm$^3$.

Any of the organic layers can be formed of any desired surface roughness. The organic layer can have a surface roughness, expressed as the root mean square of the surface thickness deviation in an area 10 µm$^2$, of from about 0.1 nm to about 10 µm, from about 0.25 nm to about 5.0 µm, from about 0.5 nm to about 1.0 µm, from about 0.5 nm to about 10.0 nm, from about 1.0 nm to about 500 nm, from about 5.0 nm to about 250 nm, from about 10 nm to about 125 nm, from about 20 nm to about 100 nm, from about 25 nm to about 75 nm, or from about 40 nm to about 50 µm. For example, roughness can be provided on a scale of less than 20 nm or less than 5 nm. In some embodiments, the area measured is a 10 µm by 10 µm surface.

The first baked organic layer or any other organic layer described herein can comprise at least one of a hole injection layer, a hole transport layer, an emission layer, an electron transport layer, an electron injection layer, and a blocking layer. As used herein, the term "organic" can include small molecule organic materials, as well as polymers, that can be used to fabricate organic opto-electronic devices. A small molecule can refer to any organic material that is not a polymer, and "small molecules" can be relatively large in size and/or mass. Small molecules can include repeated units. Small molecules can also be incorporated into polymers, for example, as pendent groups on a polymer backbone or as a part of the backbone. Small molecules can also serve as the core moiety of a dendrimer that consists of a series of chemical shells built on the core moiety. The core moiety of a dendrimer can be a fluorescent or phosphorescent small molecule emitter. A dendrimer can be a "small molecule," and all dendrimers used in the field of OLEDs can be small molecules. A small molecule generally has a well-defined chemical formula with a single molecular weight, whereas a polymer has a chemical formula and a molecular weight range or a weight that can vary from molecule to molecule. As used herein, "organic" can also include, in some cases, metal complexes of hydrocarbon and heteroatom-substituted hydrocarbon ligands.

Any suitable hole injection material can be employed for a hole injection layer or other layer. A hole injection layer (HIL) can planarize or wet the anode surface so as to provide efficient hole injection from the anode into the hole injecting material. In some embodiments, the hole injection layer can comprise a solution-deposited material, such as a spin-coated polymer, for example, PEDOT:PSS, or it can comprise a vapor-deposited small molecule material, for example, CuPc or MTDATA. The hole injection layer can also have a charge carrying component having HOMO (Highest Occupied Molecular Orbital) energy levels that favorably match up, as defined by their herein-described relative ionization potential (IP) energies, with the adjacent anode layer on a first side of the HIL, and the hole transporting layer on a second, opposite side of the HIL. The "charge carrying component" is the material responsible for the HOMO energy level that actually transports holes. This component can be the base material of the HIL, or it can be a dopant. Using a doped HIL allows the dopant to be selected for its electrical properties, and the host to be selected for morphological properties such as wetting, flexibility, toughness, and the like. Properties for the HIL material can be provided such that holes can be efficiently injected from the anode into the HIL material. The thickness of the HIL can be thick enough to help planarize or wet the surface of the anode layer, for example, a thickness of from about 10 nm to about 50 nm.

Any suitable hole transport material can be employed for a hole transport layer or other layer. For example, the hole transport layer can include a material capable of transporting holes. The hole transport layer can be intrinsic (undoped), or doped. Doping can be used to enhance conductivity. α-NPD and TPD are examples of intrinsic hole transport layers. An example of a p-doped hole transport layer is m-MTDATA doped with $F_4$-TCNQ at a molar ratio of 50:1, as described in United States Patent Application Publication No. US 2003/0230980 A1 to Forrest et al., which is incorporated herein by reference in its entirety. Other hole transport layers can be used.

Any suitable light-emitting material can be employed for a light-emitting layer (EML). The EML can comprise an organic material capable of emitting light when a current is passed between the anode and cathode. The emitting layer can contain a phosphorescent emissive material, although fluorescent emissive materials can instead, or additionally, be used. Phosphorescent materials can have higher luminescent efficiencies. The emissive layer can also comprise a host material capable of transporting electrons and/or holes, for example, doped with an emissive material that can trap electrons, holes, and/or excitons, such that excitons relax from the emissive material via a photoemissive mechanism. The emitting layer can comprise a single material that combines transport and emissive properties. Whether an emitting material is a dopant or a major constituent, an emitting layer can comprise other materials, such as dopants, that tune the emission of the emissive material. An EML can include a plurality of emitting materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP, and mCP. Examples of emitting materials and host materials are described in U.S. Pat. No. 6,303,238 B1 to Thompson et al., which is incorporated herein by reference in its entirety.

Emitting materials can be included in the EML in a number of ways. For example, an emitting small molecule can be incorporated into a polymer. For example, a small molecule can be incorporated into the polymer as a separate and distinct molecular species, by incorporation into the backbone of the polymer so as to form a co-polymer, or by bonding as a pendant group on the polymer. Other emissive layer materials and structures can be used. For example, a small molecule emissive material can be present as the core of a dendrimer.

Any suitable electron transport material can be employed for the electron transport layer. The electron transport layer can include a material capable of transporting electrons. The electron transport layer can be intrinsic (undoped), or doped. Doping can be used to enhance conductivity. $Alq_3$ is an example of an intrinsic electron transport layer. An example of an n-doped electron transport layer is BPhen doped with Li at a molar ratio of 1:1, as described in U.S. Patent Application Publication No. US 2003/02309890 A1 to Forrest et al., which is incorporated herein by reference in its entirety. Other electron transport layers can instead or additionally be used.

Any suitable electron injection material can be employed for the electron injection layer. The electron injection layer can be any layer that improves the injection of electrons into an electron transport layer. LiF/Al is an example of a material that can be used as an electron injection layer that injects electrons into an electron transport layer from an adjacent layer. Other materials or combinations of materials can be used for injection layers. Examples of injection layers are provided in U.S. Patent Application Publication No. US 2004/0174116 A1, which is incorporated herein by reference in its entirety.

Blocking layers can be used to reduce the number of charge carriers (electrons or holes), and/or the number of excitons, that leave the EML. An electron blocking layer can be located between an EML and a HTL to block electrons from leaving the emissive layer in the direction of the HTL. If included, the hole blocking layer can be located between an EML and an ETL to block holes from leaving emissive layer in the direction of electron transport layer. Blocking layers can also or instead be used to block excitons from diffusing out of the emissive layer. The theory and use of blocking layers is described in more detail in U.S. Pat. No. 6,097,147 and United States Patent Application Publication No. US 2003/02309890 A1 to Forrest et al., which are herein incorporated by reference in their entireties. A "blocking layer" is a layer that can provide a barrier that significantly inhibits transport of charge carriers and/or excitons through the device, without necessarily completely blocking the charge carriers and/or excitons. The presence of such a blocking layer in a device can result in substantially higher efficiencies as compared to a similar device that lacks a blocking layer. A blocking layer can be used to confine emission to a desired region of an OLED.

A protective layer can be used to protect underlying layers during subsequent fabrication processes. For example, the processes used to fabricate metal or metal oxide electrodes can damage organic layers, and a protective layer can be used to reduce or eliminate such damage. A protective layer can have a high carrier mobility for the type of carrier that it transports, such that it does not significantly increase the operating voltage of a device. CuPc, BCP, and various metal phthalocyanines are examples of materials that can be used in protective layers. Other materials or combinations of materials can be used. The thickness of protective layer can be preferably thick enough so that there is minimal damage to underlying layers due to fabrication processes that occur after an organic protective layer is deposited, yet not so thick as to significantly increase the operating voltage of a device. A protective layer can be doped to increase its conductivity. For example, a CuPc or BCP protective layer can be doped with Li. Protective layers can be employed as described in U.S. Patent Application Publication No. US 2004/0174116 A1, which is incorporated herein by reference in its entirety.

Materials that can be deposited by the apparatus and methods herein include, among other things, organic materials, metal materials, and inorganic semiconductors and insulators, such as inorganic oxides, chalcogenides, Group IV semiconductors, Group III-V compound semiconductors, and Group II-VI semiconductors. Any of the following materials or others known in the art can be employed: 4,4'-N,N-dicarbazole-biphenyl m-MTDATA 4,4',4''-tris(3-methylphenylphenlyamino)triphenylamine (CBP); 8-tris-hydroxyquinoline aluminum ($Alq_3$); 4,7-diphenyl-1,10-phenanthroline (Bphen); tetrafluoro-tetracyanoquinodimethane ($F_4$-TCNQ); tris(2-phenylpyridine)-iridium ($Ir(ppy)_3$); 2,9-dimethyl-4,7-diphenyl-1,10-phenanthroline (BCP); copper phthalocyanine (CuPc); indium tin oxide (ITO); N,N-diphenyl-N—N'-di(1-naphthyl)-benzidine (NPD); N,N'-diphenyl-N—N'-di(3-toly)-benzidine (TPD); 1,3-N,N-dicarbazole-benzene (mCP); 4-(dicyanoethylene)-6-(4-dimethylaminostyryl-2-methyl)-4H-pyran (DCM); N,N'-dimethylquinacridone (DMQA); an aqueous dispersion of poly(3,4-ethylenedioxythiophene) (PEDOT) with polystyrenesulfonate (PSS); N,N'-di(naphthalene-1-yl)-N,N'-diphenyl-benzidine (NPB) and other materials described in US 2009/0045739 A1 which is incorporated herein in its entirety by reference; an electron transport material such as those described in US 2009/0167162 A1 which is incorporated herein in its entirety by reference; and the hole transport materials described, for example, in US 2007/0134512 A1 which is incorporated herein in its entirety by reference.

The materials to be transferred or otherwise deposited can be modified to make them compatible with a particular deposition method. For example, substituents such as alkyl and aryl groups, branched or unbranched, can be used in small molecules to enhance their ability to undergo solution processing. Substituents can be used. Materials with asymmetric structures can have better solution processability than those having symmetric structures, because asymmetric materials can exhibit a lower tendency to recrystallize. Dendrimer substituents can be used to enhance the ability of small molecules to undergo solution processing.

The methods of the present teachings generally employ an inkjet printing or thermal printing printhead to deposit at least one organic layer or other layer on a substrate. Deposition by other means such as by vacuum thermal evaporation (VTE) can alternatively, or additionally, be used to form one or more layers on a substrate. For example, the method can further comprise depositing at least one organic material or other material on at least one of the substrate and a first baked organic layer by vacuum thermal evaporation, to form an organic layer. The vacuum thermal evaporation step can be performed before and/or after an inkjet printing or thermal printing step. Any combination of thermal printing, inkjet printing, vacuum thermal evaporation, or other deposition methods can be employed to build up one or more layers. For example, a combination of inkjet printing or thermal printing, and vacuum thermal evaporation, can be employed to deposit a buffer layer. A combination of inkjet printing or thermal printing, and vacuum thermal evaporation, can be employed to build up at least one of a hole injection layer, a hole transport layer, an emission layer, an electron transport layer, and an electron injection layer.

At least one of the depositing step and the baking step can be performed in an inert atmosphere. Other steps can also be performed in an inert atmosphere. Any suitable inert atmosphere can be employed. For example, an atmosphere comprising nitrogen, helium, neon, argon, krypton, xenon, or any combination thereof can be employed. Non-inert atmospheres can also be employed. When an inert atmosphere is employed it need not be completely inert, and can comprise a low level of reactive molecules. In some cases a nitrogen gas ($N_2$) atmosphere can be used that comprises 100 ppm oxygen gas, or less.

The substrate used in accordance with the present teachings can be any suitable substrate that provides desired structural properties. The substrate can be flexible or rigid. The substrate can be transparent, semi-transparent, translucent, or opaque. Plastic and glass are examples of preferred rigid substrate materials. Plastic and metal foils are examples of preferred flexible substrate materials. The substrate can comprise a semiconductor material that facilitates the fabrication of circuitry. For example, the substrate can comprise a silicon wafer upon which circuits are fabricated, and which is capable of controlling OLED layers that are subsequently deposited on the substrate. Other substrate materials can be used. The material and thickness of the substrate can be chosen to obtain desired structural and optical properties.

One or more electrodes can be employed in the methods, apparatuses, and systems of the present teachings. The electrodes can comprise an anode, a cathode, or both. The first baked organic layer or another layer can be formed immediately adjacent the electrode. The first baked organic layer or other layer can be formed directly on the electrode. Methods comprising the transfer, deposition, or other application of the first electrode can further comprise transferring a second electrode on one or more first baked organic layers or on a layer deposited thereon, to form an OLED structure. At least one organic layer or other layer can be deposited between the first baked organic layer and the second electrode.

OLEDs are generally (but not always) intended to emit light through at least one of the electrodes, and one or more transparent electrodes can be useful in an organic opto-electronic device. For example, a transparent electrode material, such as indium tin oxide (ITO), can be used. A transparent top electrode, such as described in U.S. Pat. Nos. 5,703,436 and 5,707,745, which are incorporated herein by reference in their entireties, can be used. A transparent bottom electrode can be used instead of, or in combination with, a transparent top electrode. For a device intended to emit light only through one electrode, the other electrode does not need to be transparent, and can instead comprise a thick and reflective metal layer having a high electrical conductivity. For a device intended to emit light only through one electrode, the other electrode can be opaque and/or reflective. Where an electrode does not need to be transparent, using a thicker layer can provide better conductivity and better stability, and using a reflective electrode can increase the amount of light emitted through the other electrode by reflecting light back toward the transparent electrode.

Fully or partially transparent devices can be made in accordance with the present teachings where both electrodes are at least partially transparent. In some embodiments, side-emitting OLEDs can be fabricated and one or both electrodes can be opaque or reflective in such devices.

The electrode, anode, or cathode, can be constructed out of any suitable material or combination of materials. An anode used in accordance with the present teachings can be any suitable anode that is sufficiently conductive to transport holes to the organic layers. Anode materials can include conductive metal oxides, such as indium tin oxide (ITO), indium zinc oxide (IZO), aluminum zinc oxide (AlZnO), and metals. The anode and substrate can be sufficiently transparent to create a device that allows emission from the anode side of the OLED stack. An example of a transparent substrate and anode combination is a commercially available ITO (anode) deposited on glass or plastic (substrate). Flexible and transparent substrate-anode combinations are described in U.S. Pat. No. 5,844,363 and U.S. Pat. No. 6,602,540 B2, which are incorporated herein by reference in their entireties. The anode can be translucent, transparent, semi-transparent, opaque, and/or reflective. The material and thickness of the anode can be chosen to obtain desired conductive and optical properties. Where the anode is transparent, there can be a range of thicknesses for a particular material whereby the material is thick enough to provide a desired conductivity yet thin enough to provide a desired degree of transparency and, in some cases, flexibility. Other anode materials and structures can be used.

The cathode can comprise any suitable material or combination of materials known in the art such that the cathode is capable of conducting electrons and injecting them into the organic layers of the device. The cathode can be translucent, transparent, semi-transparent, opaque, and/or reflective. Metals and metal oxides are examples of suitable cathode materials. The cathode can comprise a single layer, or can have a compound structure. For example, a cathode can be provided as a compound cathode having a thin metal layer and a thicker conductive metal oxide layer. In a compound cathode, materials for the thicker layer can include ITO, IZO, and other materials known in the art. U.S. Pat. Nos. 5,703,436, 5,707, 745, U.S. Pat. No. 6,548,956 B2, and U.S. Pat. No. 6,576,134 B2, which are incorporated herein by reference in their entireties, describe examples of cathodes including compound cathodes having a thin layer of metal such as Mg:Ag and an overlying transparent, electrically-conductive, sputter-deposited ITO layer. Other cathode materials and structures can be used. Thin film transistors (TFTs) and/or other electronic elements can be incorporated into OLEDs, for example, adjacent the electrodes.

Thermal printing can be carried out using the methods and inks as described in U.S. Patent Application Publications Nos. US 2008/0311307 A1, US 2008/0308037 A1, US 2006/0115585 A1, US 2010/0188457 A1, US 2011/0008541 A1, US 2010/0171780 A1, and US 2010/0201749 A1, which are incorporated herein by reference in their entireties. An ink dispenser and a transfer surface, for example, a nozzle, which, in combination can comprise a printhead, can be employed. The ink dispenser can comprise, for example, an inkjet, and the transfer surface can be adapted to discharge a film of material in a substantially dry or solid form. An inkjet dispenser having any number of openings (orifices) for ejecting liquid ink onto/into one or more transfer surfaces can be employed. Upon activation, ink droplets can be ejected from a chamber. The activation means (for example, energy source or sources, such as thermal and/or mechanical) for ejecting ink can be configured so that multiple droplets are ejected substantially simultaneously. In addition, or instead, the activation means can be configured so that the plural droplets are ejected serially from each orifice. Droplets can be deposited onto a single target micro-pore array utilizing orifices directed at the array from plural ink-holding chambers. Each of multiple chambers associated with a target micro-pore array can include one or more orifices for delivering liquid ink droplets thereto.

Discharge devices that can be employed include those described, for example, in U.S. Patent Application Publication No. US 2006/0115585 A1, which is incorporated herein by reference in its entirety. An exemplary apparatus for deposing an organic material on a substrate can include a housing having a transfer surface, for example, a nozzle, at one end and a reservoir (chamber) at another end. The reservoir can contain organic constituents used for forming an OLED film. The organic constituent can be liquid, solid, or a combination thereof. A heat source can be provided to heat the reservoir and the contents thereof. The heat source can provide heating, for example, to temperatures of from about 100° C. to about 700° C. The heat source or other heater can be activated in a pulse-like manner to provide heat to a discharge device cyclically. The apparatus housing can optionally include an inlet and an outlet. The inlet and outlet can be defined by a flange adapted to receive a carrier gas or transport gas. The carrier gas can be any suitable gas or combination of gasses, for example, an inert gas such as nitrogen, argon, or other inert gas described herein. A delivery path can be formed within the housing to guide the flow of the carrier gas. Thermal shields can be positioned to deflect thermal radiation from the heat source so as to protect the discharge device and organic particles contained therein or thereon. Carrier gasses need not be employed and are not used according to various embodiments. Proximity and favorable concentration gradients between a transfer surface and a substrate can aid in transfer of organic or other material.

An exemplary apparatus for depositing a material on a substrate can comprise a chamber, plural orifices, a transfer surface, and one or more micro-porous conduits referred to as micro-pores. The chamber can receive ink in liquid form and communicate the ink from the orifices to the transfer surface. The ink can comprise, for example, suspended or dissolved particles in a carrier liquid or solvent. These particles can comprise, for example, single molecules or atoms, aggregations of molecules and/or atoms, or any combination thereof. The transfer surface can comprise micro-pores separated by partitions. Micro-pores can include micro-porous material therein. A surface of transfer surface proximal to the orifices can define inlet ports to the transfer surface while the distal surface of transfer surface, which faces away from the orifices, can define outlet ports. A substrate can be positioned proximal to the outlet ports of the transfer surface, for receiving ink deposited therefrom. The pores can be of any suitable size. For example, the pore size can be from about 5.0 nm to about 100 µm.

A heater can be added to the chamber for heating and/or dispensing ink or other organic material. Any suitable heater can be used, for example, a MEMS heater. The heater can comprise any thermal energy source(s) operably coupled to the chamber and/or orifices for providing pulsating energy to the liquid ink and thereby discharging a respective droplet of the liquid ink through each orifice. The heater can deliver heat in pulses having a duration of one minute or less. The heater can be energized with square pulses having a variable duty cycle and a cycle frequency of 1 kHz. The heater energy can be used to meter the quantity of ink or other organic material delivered from the chamber to the discharge nozzle. The chamber can also contain material, other than ink, useful for forming a film or other layer used in the fabrication of an OLED or transistor. Orifices can be configured such that surface tension of the liquid in the chamber prevents discharge of the liquid prior to activation of the mechanism for dispensing the ink. Any suitable energy source can be coupled to the chamber, which is capable of providing energy sufficient to eject droplets of liquid ink from the orifices. Exemplary sources include, for instance, mechanical and vibrational sources. A piezoelectric material can be used instead of, or in addition to, the heater. Each orifice can be coupled to a separate heater and/or piezoelectric material. For example, three heating elements can be provided, one for, and proximate to, each orifice.

A transfer surface or other discharge device can include partitions (or rigid portions) separated by conduits or micro-pores. The micro-pores and rigid portions can collectively define a micro-porous environment. The micro-porous environment can comprise a variety of materials, including, for example, micro-porous alumina or solid membranes of silicon or silicon carbide, and which have micro-fabricated pores. Micro-pores are configured to prevent the material dissolved or suspended in the liquid from escaping through the transfer surface until the medium is appropriately activated. When the discharged droplets of liquid encounter the transfer surface, the liquid is drawn into the micro-pores with assistance from capillary action. The liquid in the ink can evaporate prior to activation of the discharge nozzle, leaving behind a coating of the suspended or dissolved particles on the micro-pore walls.

The carrier liquid can comprise, for example, one or more solvents. The liquid in the ink can comprise one or more solvents having a relatively low vapor pressure. Alternatively, or in addition, the liquid in the ink can comprise one or move solvents with a relatively high vapor pressure. The one or more solvents can have a vapor pressure such that during the transportation and deposition process the solvent is substantially evaporated and the plurality of particles that were carried by the carrier liquid are deposited as solid particles. Thus, the deposited plurality of solid particles can comprise a film or layer on the substrate. The concentration of the particles in the carrier liquid can be measured using any suitable metric. For example, solids content in the liquid ink can be used as a concentration measure.

The evaporation of the liquid in the ink can be facilitated or accelerated by heating the transfer surface. The evaporated liquid can be removed from the chamber and subsequently collected, for instance, by flowing gas over one or more face of the transfer surface. Depending on the desired application, micro-pores can provide conduits (or passages) having a minimum linear cross-sectional distance W of a few nanometers to hundreds of microns. The micro-porous region comprising the transfer surface or other discharge device can take a different shape and cover a different area (for example, rectangular, L-shaped, triangular, chevron-shaped, and the like) depending on the desired application, with a typical maximum linear cross-sectional dimension DL ranging from a few hundred nanometers to tens or hundreds of millimeters. In one embodiment, the ratio of W/D is in a range of from about 1/5 to about 1/1000.

The transfer surface can be actuated by a heater, for example, by a nozzle heater. A heater can be positioned proximal to the transfer surface. Any type of heater can be used, for example, a MEMS heater. The heater can comprise a thin metal film. The thin metal film can comprise, for example, platinum. When activated, the heater can provide pulsating thermal energy to the transfer surface, which acts to dislodge the material contained within the micro-pores or conduits. The material can subsequently be transferred from the transfer surface. In some embodiments, the pulsations can be variable on a time scale of one minute or less. The transfer surface can be adapted to heat the material on the transfer surface to a desired temperature or temperatures, or across a range of temperatures. For example, the heater can heat the material on a transfer surface to one or more temperatures within a range of from about 75° C. to about 500° C., or from about 100° C. to about 400° C.

Dislodging the ink particles can occur, for example, through vaporization, either by sublimation or by melting and subsequent boiling. The material (for example, ink particles in a carrier liquid) on a transfer surface can be initially heated, for example, to about 100° C., to evaporate carrier liquids. The remaining solids (for example, ink particles which are free, or substantially free, of solvents) are then heated, for example, to about 300° C., such that they are turned into a gas. Thereafter, the gas can be deposited onto a substrate, where it solidifies. One or more films can be formed thereby. Particles can include, for example, anything from a single molecule or atom to a cluster of molecules or atoms, or a combination thereof. Any suitable energy source coupled to the transfer surface or other discharge device can be employed that is capable of energizing the transfer surface or other discharge device to thereby discharge the material from the micro-pores. In an example, mechanical (for example, vibrational) energy is used. In one embodiment of the present teachings, a piezoelectric material can be used instead of, or in addition to, one or more heaters.

A solvent-free material can be deposited on a substrate, for example, with a printhead having a multi-orifice inkjet, in accordance with the present teachings. Further, multiple printheads can be arrayed in an apparatus having multiple transfer surfaces, each with a corresponding multi-orifice inkjet. Still further, one or more reservoirs can supply liquid ink to the chamber(s) of a printhead apparatus. Printheads can be arrayed together with multiple reservoirs supplying ink to one or more associated liquid-holding chambers. A target array of micro-pores intended to receive liquid ink can be circumscribed by a retaining wall which forms a confining well to mechanically confine ink, and/or other material, supplied to the inlets of the micro-pores. The positioning system can be employed for adjusting the position of the printhead or printhead array. A substrate-positioning system can be employed. The sidewalls of the micro-pores can have defined non-cylindrical geometries, for example, they can be tapered such that the diameter of each micro-pore increases in a direction from the inlet end to the outlet end. A control system can be provided for controlling a printhead having a multi-orifice liquid-holding chamber and a transfer surface.

As described herein, the thermal printing systems can use an inkjet printhead to load a transfer surface for subsequent thermal printing. Although aspects of the present teachings use thermal printing techniques, in some embodiments an inkjet printing technique is used, not to transfer ink to a thermal printing printhead, but rather to transfer ink directly onto the device, for example, directly to the substrate or to an already deposited organic layer on the substrate. Inkjet printing as such can be used to deposit one or layers onto a front end device or intermediate structure, a backend device or intermediate structure, or onto another structure that eventually will become incorporated into and be a part of the device. Following application of liquid ink onto the substrate directly by inkjet printing, the carrier can be driven off with heat, vacuum, pressure, a gas stream, exposure to radiation, or a combination thereof. Inkjet printing can thus form an organic material pre-bake layer that can be baked as described above, for example, the same way an organic material pre-bake layer is baked for the various purposes described above, subsequent to a thermal printing process.

With inkjet printing, heating can be used to drive off the carrier and can comprise a separate and distinct step from subsequently baking the layer. In some cases, heating to drive off ink carrier or solvent can be continuous with the baking. A relatively lower heating temperature and/or duration can be used depending on ambient pressure, exposure to radiation, and the like. The presence and strength of vacuum conditions can speed the driving off of carrier. Higher heating temperatures can enable shorter heating durations.

Liquid ink can be deposited by inkjet printing using one or more pass of an inkjet printhead. Any one particular location on a substrate can be patterned with ink using an inkjet printer to form an organic layer or pattern. When using multiple passes, each pass can result in a sub-layer that comprises a particular organic layer useful in an OLED device. As the surface properties of the substrate can change with each layer of liquid ink that is deposited, the change in surface properties resulting from the deposition can be taken into consideration when depositing a subsequent layer of material on top. For example, if a material of a layer is generally hydrophilic, the layer might readily receive a subsequent layer of material dissolved in a first solvent, whereas if the material is generally hydrophobic, the layer might not readily receive the subsequent layer. In such a case, solvent combinations could be used that compensate for the changing properties of the surface set to receive a layer of a specific material. Subsequent passes can deposit subsequently smaller amounts of liquid ink or cover smaller areas relative to a previous deposited layer, which can be useful to prevent or minimize spill-over, running, and blurring, for example, of a given pixel.

Using an appropriate carrier well suited for the particular organic material to be deposited can result in an ink that does not substantially dissolve or suspend organic material on which the ink is to be deposited. Inks can be chosen that will not affect any of a plurality of layers previously deposited. For example, orthogonal liquid ink systems can be used wherein after a first ink comprising a first carrier is deposited to form a first layer, a second ink is chosen comprising a carrier that does not interfere with the first layer. In an example, the second ink is used that comprises a solvent in which a previously deposited material layer is not soluble. The respective carriers of each of two liquid inks of an orthogonal set would not dissolve, or at least not substantially dissolve, the organic material dissolved in the other carrier. Inks can be chosen such that each subsequently deposited ink contains an organic material having a glass transition temperature or temperature range that is lower than the organic material of one or more previously deposited organic material layers. Heating can be used to drive off the carrier and the heating can be below, equal to, or above the glass transition temperature or temperature range of the organic material of the layer. In some embodiments, the heating is below the glass transition temperature or temperature range of one or more organic materials that has previously been deposited.

The present teachings are not limited to the deposition of organic layers and can additionally, or alternatively, include the deposition of metal material onto a substrate. The deposited metal material can be deposited in substantially solid form. The deposited material can include metal formed utilizing organo-metallic precursor materials dissolved or suspended in a solvent, or metal dissolved or suspended in a solvent. The metal dissolved or suspended in a solvent can comprise, at least partially, nanoparticles, which can be coated with organic compounds. The metal can comprise, for instance, gold, silver, aluminum, magnesium, or copper. The metal can comprise an alloy or mixture of multiple metals. Such metal material is useful in many applications, for instance, as a thin film electrode, as an electrical interconnection between electronic circuit elements, and for forming passive absorptive or reflective patterns. Metal films deposited by the discharge apparatus can be used to deposit the electrodes and electrical interconnections utilized in circuits including organic electronic devices such as OLEDs, transistors, photodetectors, solar cells, and chemical sensors. Organo-metallic or metallic material can be delivered to the transfer surface or other discharge device, and upon activation of the transfer surface, can be delivered to the substrate. A reaction converting the organo-metallic material into metallic material can be carried out prior to, and/or can occur during, delivery of the liquid from the chamber to the transfer surface, delivery from the discharge nozzle to the substrate, or following deposition on the substrate. Inkjet printing or thermal printing can be used to deposit one or more metal layers on a substrate.

Inorganic semiconductor or insulator material in substantially solid form can be deposited onto a substrate in accordance with the present teachings. The deposition material can include organic and inorganic precursor materials dissolved or suspended in a carrier liquid, or inorganic semiconductor or insulator material dissolved or suspended in a carrier liquid. The inorganic semiconductor or insulator material dissolved or suspended in a liquid can comprise (all, or in part) nanoparticles, which can be coated with organic compounds. The inorganic semiconductor or insulator can comprise, for instance, group IV semiconductors (for instance, carbon, silicon, germanium), group III-V compound semiconductors (for instance, gallium nitride, indium phosphide, gallium arsenide), group II-VI compound semiconductors (for instance, cadmium selenide, zinc selenide, cadmium sulfide, mercury telluride), inorganic oxides (for instance, indium tin oxide, aluminum oxide, titanium oxide, silicon oxide), and chalcogenides. The inorganic semiconductor or insulator can comprise an alloy or mixture of multiple inorganic compounds. The semiconductor or insulator material can be useful in many applications, for instance, as a transparent conductor for an electrode, as an electrical interconnection between electronic circuit elements, as an insulating and passivation layer, and as an active layer in an electronic or optoelectronic device. When integrated together, these layers can be utilized in circuits containing organic electronic devices such as OLEDs, transistors, photodetectors, solar cells, and chemical sensors.

The present teachings can employ the thermal printing apparatuses, systems, and methods as described in U.S. Patent Application Publication No. US 2010/0201749 A1, which is incorporated herein by reference in its entirety. The inkjet printing or thermal printing operation can include OLED printing and the material to be printed can include any suitable ink composition. In an exemplary embodiment, the printing process can be conducted at a load-locked printer housing having one or more chambers. Each chamber can be partitioned from the other chambers by physical gates or fluidic curtains. The controller can coordinate transportation of a substrate through the system and purges the system by timely opening appropriate gates. The substrate can be transported using gas bearings which are formed using a plurality of vacuum and gas input portals. The controller can also provide a non-oxidizing environment within the chamber using a gas similar to, or different from, the gas used for the gas bearings. The controller can also control the printing operation by energizing the printhead at a time when the substrate is positioned substantially thereunder. The controller can identify the location of the substrate through the load-locked print system and dispense ink from the printhead only when the substrate is at a precise location relative to the printhead. Printing registration can be employed, which refers to the alignment and the size of one printing process with respect to the previous printing processes performed on the same substrate. Printing registration can comprise pattern recognition. Substrate misalignment such as translational misalignment, rotational misalignment, magnification misalignment and combinational misalignment, can be corrected.

The present teachings can employ the thermal printing apparatuses, systems, and methods as described in U.S. patent application Ser. No. 12/954,910, filed Nov. 29, 2010, which is incorporated herein by reference in its entirety. In particular, the transfer members, material compositions, solutions, and suspensions of the application are incorporated by reference. An OLED film or layer can be formed by providing a quantity of liquid ink to a transfer surface. The liquid ink can be defined by a carrier fluid containing dissolved or suspended film material. The liquid ink can be organized into a prescribed pattern on the transfer surface with the assistance of a micro-patterned structure. The transfer surface can be energized to substantially evaporate the carrier fluid to form dry film material on the transfer surface. The film material can be transferred from the transfer surface to the substrate such that the film material deposits in substantially the solid phase. The film material deposited onto the substrate can have a patterned shape or can be a uniform coating over the entire deposition area.

An example of a liquid ink is film material dissolved or suspended in a carrier fluid. Another example of a liquid ink is pure film material in the liquid phase, such as film material that is liquid at the ambient system temperature or film material that is maintained at an elevated temperature so that the film material forms a liquid melt. An example of a solid ink is one that comprises solid particles of film material. Another example of a solid ink is a film material dispersed in a carrier solid. An example of a gas vapor ink is vaporized film material. Another example of a gaseous vapor ink is vaporized film material dispersed in a carrier gas. The ink can deposit on the transfer surface as a liquid or a solid, and such phase can be the same as or different than the phase of the ink during delivery. In an example, the film material can be delivered as gaseous vapor ink and deposited on the transfer surface in the solid phase. In another example, the film material can be delivered as a liquid ink and deposited on the transfer surface in the liquid phase. The ink can deposit on the transfer surface in such a way that only the film material deposits and the carrier material does not deposit; the ink can also deposit in such a way that the film material as well as one or more of the carrier materials deposits.

One or more parameters such as ink concentration, deposition (transfer/accumulation) rate, mass deposition rate, bake temperature, and/or bake time, as described herein, can be employed and/or adjusted so that a first baked organic layer or other layer is provided with a crystalline character. Any desired scale, type, or degree of crystallinity can be achieved. For example, microcrystallinity or nanocrystallinity can be achieved. A layer can comprise one or more of a crystalline region and an amorphous region. The organic layer formed can have a percent of crystallinity of less than 1.0%, from about 1.0% to about 100%, from about 5.0% to 90%, from about 20% to about 70%, from about 30% to about 60%, or from about 40% to about 60%, by either weight percent or volume percent of the weight or volume of a given layer or a chosen portion thereof. Crystallinity of a layer can be measured or expressed by any suitable means. For example, crystallinity can be measured by grain size. In some embodiments, crystallinity is measured by average grain size. The crystallinity of an organic layer or other layer can have a grain size, for example, an average grain size, of less than about 0.5 nm, from about 0.5 nm to about 500 μm, from about 10 nm to about 250 μm, from about 50 nm to about 100 μm, from about 100 nm to about 10 μm, from about 500 nm to about 5.0 μm, or from about 200 nm to about 1.0 μm.

Figure 6:
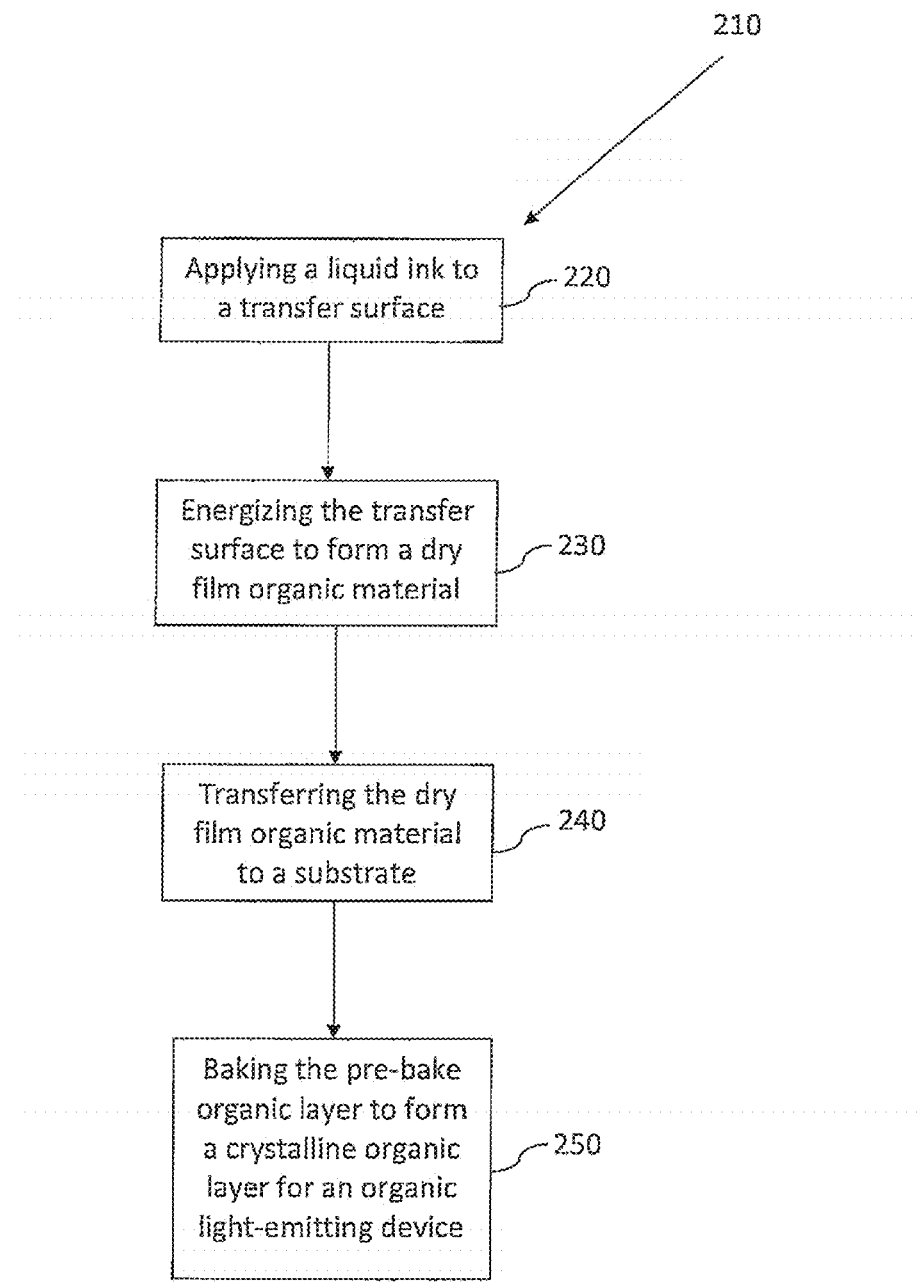
FIG. 6 is a flow diagram of a method of forming a crystalline organic layer for an organic light-emitting device in accordance with various embodiments of the present teachings.

A method of forming a crystalline organic layer for an organic light-emitting device is provided by the present teachings. The method can comprise an inkjet printing step combined with a baking step, or a thermal printing technique using a combination of an applying step, an energizing step, and a transferring step, followed by a baking step. For example, FIG. 6 is a flow diagram of a method 210 of forming a crystalline organic layer for an organic light-emitting device in accordance with the present teachings. An applying step 220 is shown followed by an energizing step 230, a transferring step 240, and a baking step 250. A liquid ink can be applied to a transfer surface for forming a layer of an organic light-emitting device. The liquid ink can be defined by a carrier fluid and dissolved or suspended film-forming organic material. The transfer surface can be energized to substantially evaporate the carrier fluid and form a dry film organic material on the transfer surface. The dry film organic material can have a glass transition range. The dry film organic material can be transferred from the transfer surface to a substrate such that the dry film organic material is deposited on the substrate in substantially a solid phase. The transfer surface can be positioned at a distance of from about 1.0 μm to about 10.0 mm from the substrate during the transferring, for example, at a distance of from about 10.0 μm to about 100.0 μm from the substrate. The dry film organic material can be deposited to build up a layer thickness at a rate of from about 0.1 nm/sec to about 1.0 mm/sec, to form a pre-bake organic layer on the substrate. The pre-bake organic layer can be baked at a bake temperature of from within the glass transition range to above the glass transition range to form a crystalline organic layer for an organic light-emitting device. The crystalline organic layer can have a conductivity of from about $1.0\times10^{-9}$ S/m to about $1.0\times10^{-7}$ S/m.

In some embodiments, the liquid ink is transferred directly to the substrate or organic layer using inkjet printing. Following application of the liquid ink to the substrate, the carrier can be driven off with heat, vacuum, a gas stream, exposure to radiation, or a combination thereof, to form an organic layer that can be baked as described in relation to the thermal printing process, to then form a crystalline layer structure.

Imparting crystallinity to one or more layers is advantageous as crystallinity can increase the conductivity of the layer. Crystallinity is particularly advantageous for a layer adjacent an electrode of an OLED stack. Crystallinity can be imparted to one or more of a hole injection layer, a hole transport layer, an emission layer, an electron transport layer, an electron injection layer, or a blocking layer. A crystalline layer or any other layer can be provided with any suitable conductivity. For example, the conductivity can be less than about $1.0\times10^{-9}$ S/m, from about $1.0\times10^{-9}$ S/m to about $1.0\times10^{-7}$ S/m, from about $2.5\times10^{-9}$ S/m to about $7.5\times10^{-8}$ S/m, from about $5.0\times10^{-9}$ S/m to about $5.0\times10^{-8}$ S/m, from about $7.5\times10^{-9}$ S/m to about $1.0\times10^{-8}$ S/m, or of greater than about $1.0\times10^{-7}$ S/m. The conductivity can be changed by orders of magnitude by changing the properties of the layer. For example, adding impurities into an organic layer can be used to change the conductivity of the layer from $10^{-9}$ S/m to $10^{-1}$ S/m.

One or more parameters such as ink concentration, deposition (transfer/accumulation) rate, mass deposition rate, bake temperature, and/or bake time, as described herein, can be employed and/or adjusted so that a first baked organic layer or other layer is provided with a porous character. A porous character is advantageous for a layer as it can reduce the index of refraction of the layer and bring the index closer to the index of refraction of a substrate, such as a glass substrate, for an OLED display. Any suitable index of refraction can be provided for a porous organic layer. The organic porous layer can have an index of refraction of less than about 1.01, from about 1.01 to about 1.60, from about 1.10 to about 1.50, from about 1.20 to about 1.40, from about 1.25 to about 1.35, or of greater than about 1.60. The index of refraction of the first organic layer or other layer can be intermediate between a refractive index of a semi-transparent or translucent substrate and a refractive index of a second organic layer. For example, the index of refraction of the semi-transparent or translucent substrate can be from about 1.01 to about 1.55 and the index of refraction of the second organic layer can be from about 1.60 to about 5.01. In some embodiments, the index of refraction of the second organic layer is from about 1.60 to about 1.80.

An organic light-emitting device is also provided in accordance with the present teachings. The device can comprise a first electrode, a crystalline organic layer, an emitting layer, and a second electrode. The crystalline organic layer can be provided over and electrically associated with the first electrode and can exhibit a conductivity of from about $1.0\times10^{-9}$ S/m to about $1.0\times10^{-7}$ S/m. The emitting layer can be provided over and electrically associated with the crystalline organic layer. The emitting layer can comprise a light-emitting organic material that emits light, upon excitation, at an emission wavelength. The second electrode can be provided over and electrically associated with the emitting layer. Organic material, upon excitation, emits light across a range of wavelengths. The range of wavelengths can fluctuate based on environmental conditions such as humidity and temperature. Generally, the wavelength range is relatively narrow, for example, 5.0 nm to about 10 nm at one half of the height of the intensity of the peak emission wavelength within the range. For purposes of the present disclosure, the nominal fluctuations in the emission wavelength range can be ignored for calculation of microcavity dimensions. The microcavity and structures of the present teachings are configured to resonate the peak emission wavelength of the organic light emitting material exhibited under normal operating conditions.

Figure 7:
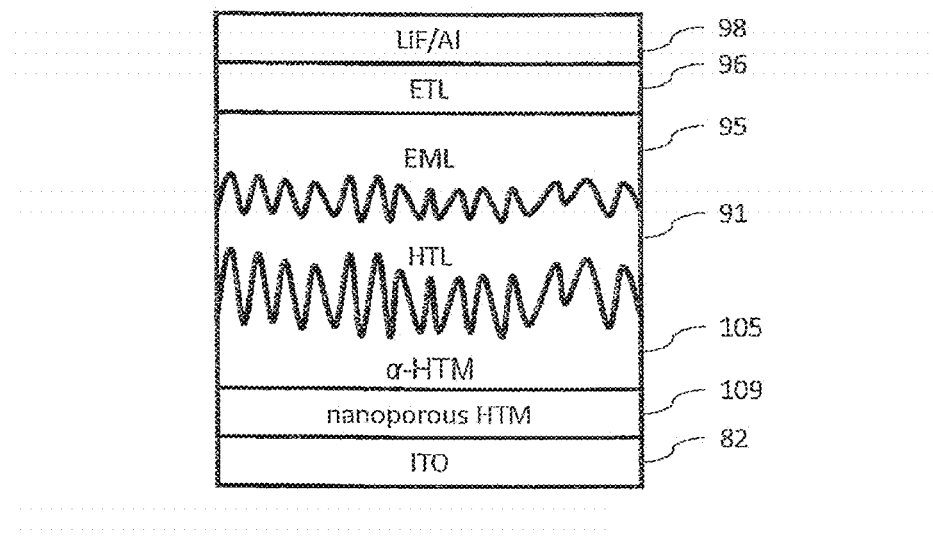
FIG. 7 is a schematic diagram illustrating an OLED stack that can be constructed using a thermal printed, low index-of-refraction, hole transport material (HTM) as a light outcoupling layer, in accordance with various embodiments of the present teachings.

FIG. 7 is a schematic diagram illustrating an OLED stack that can be constructed using a thermal or inkjet printed low index of refraction hole transport material (HTM) layer as a light out-coupling layer in accordance with the present teachings. The low index of refraction HTM layer is used to inject and/or transport charge and to out-couple light. The nanoporous layer (np-HTM) has an index of refraction that is less than the "α-HTM" layer, which can be expressed as n(α-HTM)>n(np-HTM). The stack comprises anode 82, nanoporous HTM layer 109, an α-HTM layer 105, HTL 91, EML 95, EIL 96, and cathode 98.

Figure 8:
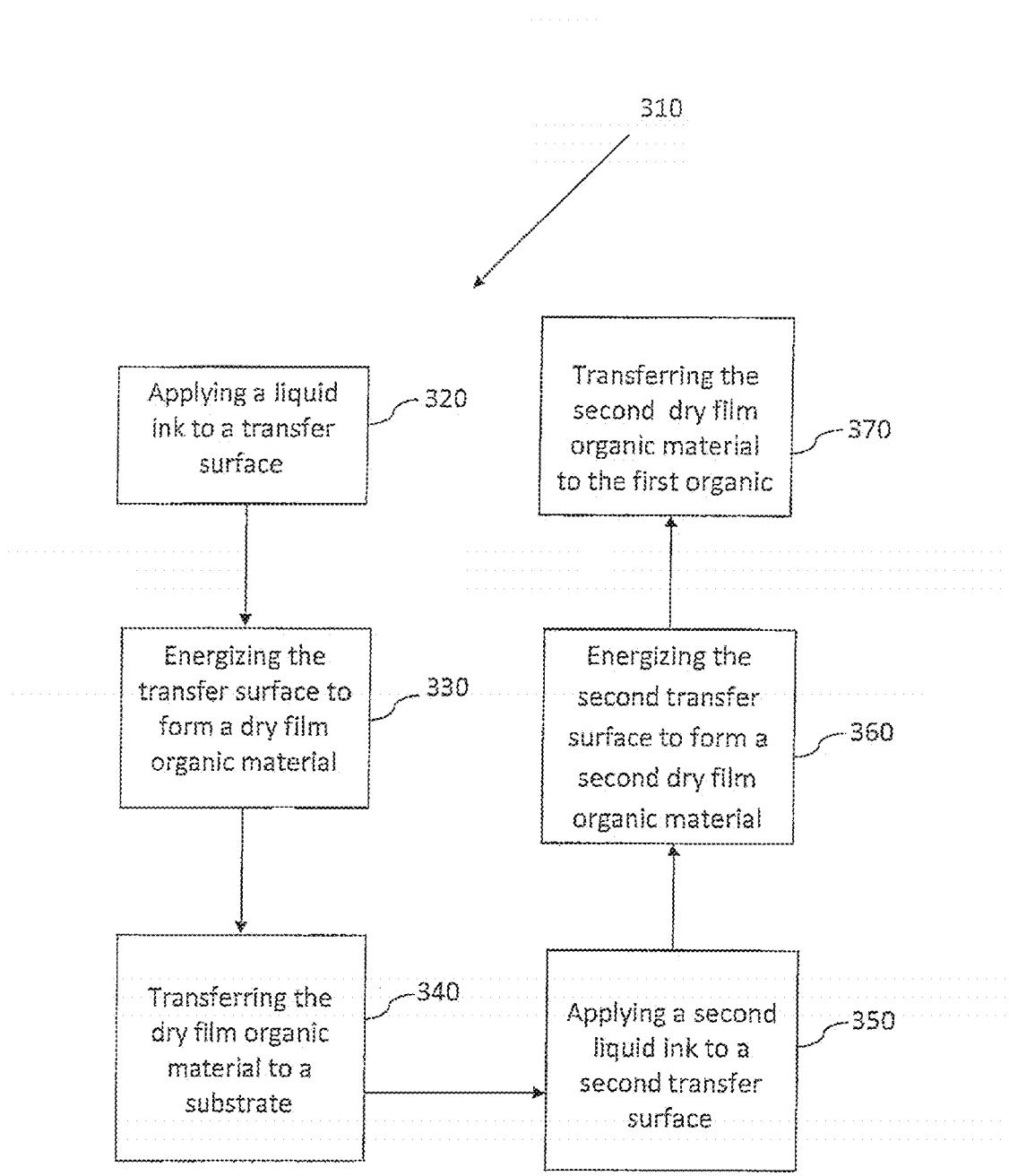
FIG. 8 is a flow diagram of a method of decreasing the refractive index of an organic layer in accordance with various embodiments of the present teachings.

A method of decreasing the refractive index of an organic layer is provided in accordance with the present teachings. The method can comprise an applying step, an energizing step, and a transferring step, which together can be repeated for multiple applications of various liquid inks. For example, FIG. 8 is a flow diagram of a method 310 of decreasing the refractive index of an organic layer in accordance with the present teachings. An applying step 320 is shown followed by an energizing step 330, and a transferring step 340. A second applying step 350 is also shown, followed by a second energizing step 360, and a second transferring step 370. A liquid ink can be applied to a transfer surface for forming a layer of an organic light-emitting device. The liquid ink can be defined by a carrier fluid and dissolved or suspended film-forming organic material. The transfer surface can be energized to substantially evaporate the carrier fluid and form a dry film organic material on the transfer surface. The dry film organic material can be transferred from the transfer surface to a semi-transparent or translucent electrode disposed on a semi-transparent or translucent substrate such that the dry film organic material is deposited on the semi-transparent or translucent electrode in substantially a solid phase. The transfer surface can be positioned at a distance of from about 1.0 μm to about 10.0 mm from the substrate during the transferring, for example, at a distance of from about 10.0 μm to about 100.0 μm from the substrate. The dry film organic material can be deposited to build up a layer thickness at a rate of less than about 100 nm/sec, to form a first organic layer. A second liquid ink can then be applied to a second transfer surface or to the same first transfer surface. The second liquid ink can be defined by a carrier fluid and dissolved or suspended film-forming organic material for forming a layer of an organic light-emitting device. The second transfer surface can be energized to substantially evaporate the carrier fluid and form a second dry film organic material on the second transfer surface. The second dry film organic material can be transferred from the second transfer surface to the first organic layer such that the second dry film organic material is deposited in substantially a solid phase. The dry film organic material can be deposited to build up a layer thickness at a rate of from about 0.1 nm/sec to about 1.0 mm/sec, to form a second organic layer. The index of refraction of the first organic layer can be intermediate between the index of refraction of the semi-transparent or translucent substrate and the index of refraction of the second organic layer. In some embodiments, the liquid ink is transferred directly to the substrate or organic layer using inkjet printing. Following application of the liquid ink to the substrate, the carrier can be driven off with heat, vacuum, or a combination thereof, to form an organic layer that can be baked as described for the thermal printing process.

In accordance with the present teachings, a porous buffer layer can be first deposited on top of an ITO (anode) by printing far from the substrate surface, for example, from a distance of greater than about 200 μm. Inkjet printing or thermal printing can be used. The great distance allows super saturated organic vapor to condense and molecules to aggregate in free space before arriving onto the substrate. Then, a deposition step follows at a closer gap, for example, at a distance of less than about 100 μm, so that the film can be dense. The bottom porous layer can exhibit a lower index of refraction (% related to the porosity) while the top dense layer is rough enough to enhance charge transport and injection into the EML. The overall device efficiency can increase. An exemplary stack using such a construction is shown in FIG. 7. Porosity can be, for example, nanoporous and/or microporous.

One or more parameters such as ink concentration, deposition (transfer/accumulation) rate, mass deposition rate, bake temperature, and/or bake time, as described herein, can be employed and/or adjusted so that a first baked organic layer or other layer is provided with a rough character. Imparting a rough character to one or more layer of an OLED is advantageous as it can promote light scattering and result in increased luminosity efficiency in view of the current or voltage applied and the amount of light leaving the OLED. A layer can be provided with any desirable roughness, for example, so as to achieve a particular luminosity efficiency when the layer is incorporated into an OLED stack or display. Such an OLED can exhibits a an increase in luminosity by a factor of from about 1.01 to about 2.0, from about 1.10 to about 1.90, from about 1.20 to about 1.80, from about 1.30 to about 1.70, from about 1.40 to about 1.60, or of greater than about 2.0, relative to the luminosity of a microcavity with the same surface but having a surface roughness of less than 5.0 nm expressed as the root mean square of the surface thickness deviation in an area of $10 \times 10 \ \mu m^2$. Incorporation of a rough organic layer into an OLED using one or more method of the present teachings can increase luminosity by a desired factor.

Figure 9:
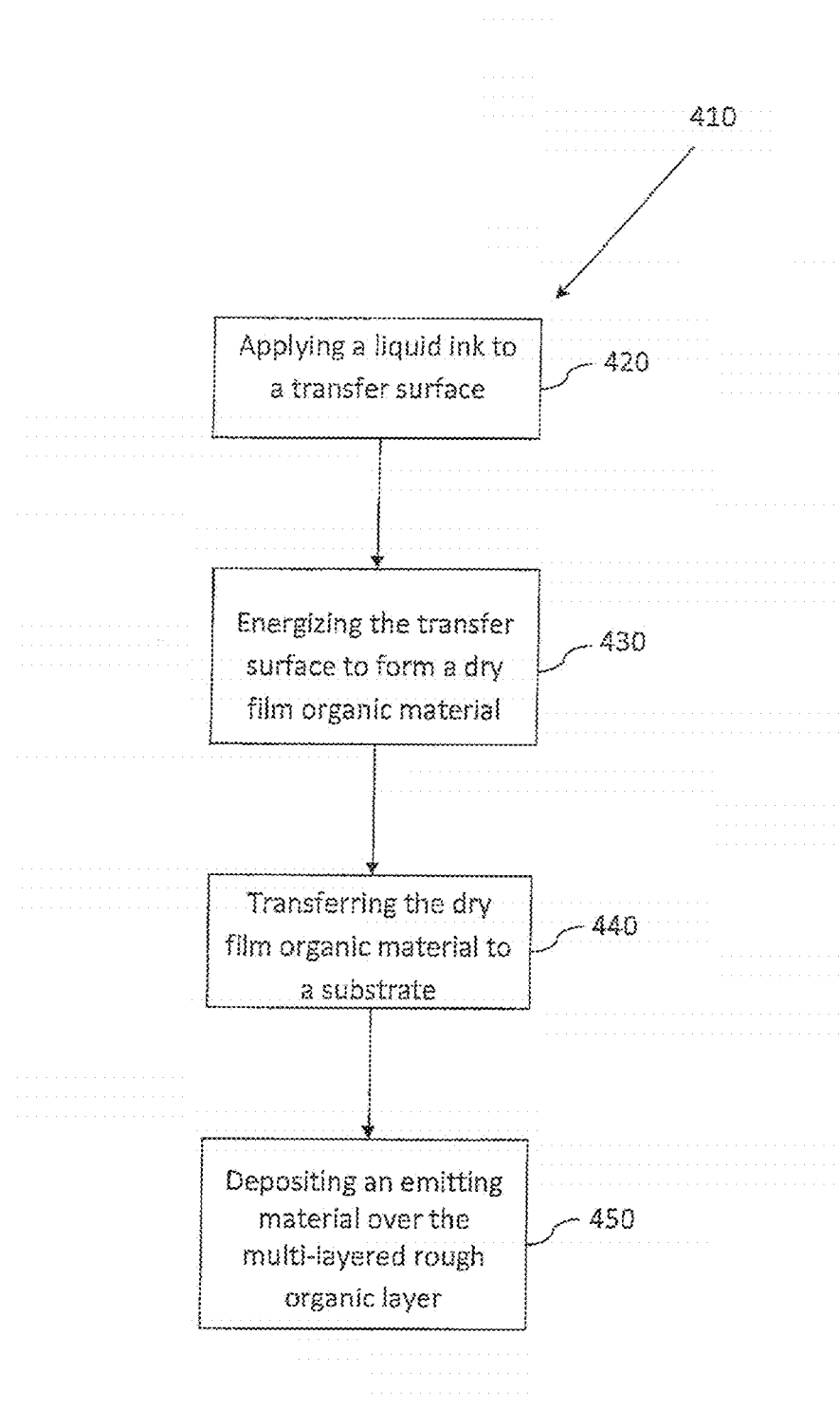
FIG. 9 is a flow diagram of a method of increasing light scattering in an organic light-emitting device in accordance with various embodiments of the present teachings.

A method of increasing light scattering in an organic light-emitting device is provided by the present teachings. The method can comprise an applying step, an energizing step, a transferring step, and a depositing step. For example, FIG. 9 is a flow diagram of a method 410 of increasing light scattering in an organic light-emitting device in accordance with the present teachings. An applying step 420 is shown followed by an energizing step 430, a transferring step 440, and a depositing step 450. A liquid ink can be applied to a transfer surface for forming a layer of an organic light-emitting device. The liquid ink can be defined by a carrier fluid and dissolved or suspended film-forming organic material. The transfer surface can be energized to substantially evaporate the carrier fluid and form a dry film organic material on the transfer surface. The dry film organic material can be transferred from the transfer surface to a substrate such that the dry film organic material is deposited on the substrate in substantially a solid phase, wherein the transfer surface is positioned at a distance of less than about 200 μm from the substrate. The transferred organic film material can be deposited to build up a layer thickness at a rate of from about 0.1 nm/sec to about 1.0 mm/sec. The transferred organic film material can be deposited and at a mass deposition rate of from about 1.0 ng/sec to about 100 μg/sec, to form a multi-layered rough organic layer. The multi-layered rough organic layer can comprise from about 2 sub-layers to about 20 sub-layers and can have a roughness of from about 5.0 nm to about 1.0 μm as the root mean squared of surface thickness deviations in an area of 10 μm². In some embodiments, the area measured is a 10 μm by 10 μm surface. An emitting material can be deposited over the multi-layered rough organic layer to form an emitting layer and to form an organic light-emitting device stack. The organic light-emitting device stack can exhibit an increase in luminosity by a factor of from about 1.01 to about 2.0 relative to the luminosity of a microcavity having the same surface but with a surface roughness of less than 5.0 nm expressed as the root mean square of the surface thickness deviation in an area of 10×10 μm².

In some embodiments, an increased light scattering layer is formed using inkjet printing directly onto the substrate or onto a previous organic layer. Following application of the liquid ink to the substrate, the carrier can be driven off with heat, vacuum, a gas stream, exposure to radiation, or a combination thereof, to form a pre-bake organic layer that can be baked as described above in relation to the thermal printing process.

An organic light-emitting device stack is provided by the present teachings. The stack can comprise a substrate. The stack can comprise a dry film organic material layer formed on the substrate and comprising from about 2 sub-layers to about 300 sub-layers, a first surface facing the substrate, and a second surface opposite the first surface. For example, the multi-layered rough organic layer can comprise from about 2 sub-layers to about 100 sub-layers, or from about 2 sub-layers to about 20 sub-layers. When each sub-layer comprises a mono-molecular layer, the multi-layered rough organic layer can comprise from about 2 sub-layers to about 300 sub-layers, from about 10 sub-layers to about 200 sub-layers, or from about 50 sub-layers to about 150 sub-layers. The multi-layered rough organic layer can have a thickness, for example, of from about 2 nm to about 300 nm, from about 20 nm to about 200 nm, or from about 50 nm to about 150 nm. The stack can comprise an emitting layer over the dry film organic material layer such that the dry film organic material layer is between the substrate and the emitting layer. The emitting layer can comprise a light-emitting organic material that emits light at an emission wavelength. The second surface can exhibit a surface roughness of from about 0.5 nm to about 1.0 μm as the root mean squared of surface thickness deviations in an area of 10 μm², for example, from about 1.0 nm to about 500 nm, from about 5.0 nm to about 500 nm, or from about 0.5 nm to about 10 nm. In some embodiments, the area measured is a 10 μm by 10 μm surface. The organic light-emitting device stack can exhibit an increase in luminosity by a factor of from about 1.01 to about 2.0 relative to the luminosity of the same microcavity but with a surface having a surface roughness of less than 5.0 nm expressed as the root mean square of the surface thickness deviation in an area of 10×10 μm².

The present teachings can employ one or more of the apparatuses, systems, methods, inks, organic materials, inorganic materials, films, layers, electrodes, and/or thin film transistors (TFTs) described in: U.S. Pat. No. 5,405,710, U.S. Pat. No. 6,811,896 B2, U.S. Pat. No. 6,861,800 B2, U.S. Pat. No. 6,917,159 B2, U.S. Pat. No. 7,023,013 B2, and U.S. Pat. No. 7,247,394 B2; U.S. Patent Application Publications Nos. US 2006/0115585 A1, US 2007/0286944 A1, US 2008/0238310 A1, US 2008/0311289 A1, US 2008/0311307 A1, US 2009/0115706 A1, US 2009/0220680 A1, US 2010/0171780 A1, US 2010/0188457 A1, US 2010/0201749 A1 and US 2011/0008541 A1; U.S. patent application Ser. No. 12/954,910, filed Nov. 29, 2010; Geffroy et al., "Organic light-emitting diode (OLED) technology: material devices and display technologies," Polym., Int., 55:572-582 (2006); Chin, "Effective hole transport layer structure for top-emitting organic light emitting devices based on laser transfer patterning," J. Phys. D: Appl. Phys. 40:5541-5546 (2007); Huang et al., "Reducing Blueshift of Viewing Angle for Top-emitting Organic Light-Emitting Devices" (2008); Lee et al., "Microcavity Effect of Top-Emission Organic Light-Emitting Diodes Using Aluminum Cathode and Anode," Bull. Korean Chem. Soc., 2005, Vol. 26, No. 9; Organic Electronics: Materials, Processing, Devices, and Applications, (So, ed.), CRC Press New York (2010); Bulovic et al., Phys., Rev. B 58: 3730 (1998); and Lee et al., Appl. Phys. Lett. 92 (2008) 033303, which are incorporated herein by reference in their entireties.

The use of a microcavity in an OLED device has been shown to reduce the emission bandwidth and improve the color purity, or chromaticity, of emission, see, for example, U.S. Pat. No. 6,326,224 B1, which is incorporated herein by reference herein in its entirety. A microcavity can also significantly change the angular distribution of the emission from an OLED device. One or more methods of the present teachings can be employed to form one or more OLED microcavities. One or more parameters such as ink concentration deposition (accumulation) rate, mass deposition rate, number of inkjet passes, bake temperature, and/or bake time, as described herein, can be employed and/or adjusted to form an OLED microcavity. The length and depth of a microcavity can be adjusted by the application of an organic buffer layer. The organic buffer layer can comprise any of the inkjet and/or thermal printing formed layers described herein. The OLED microcavity comprises a light-emitting layer and first and second reflective electrodes. The emitting layer can be spaced from the first reflective electrode by a first distance and spaced from the second reflective electrode by a second distance. The first and second distances can be optimized for maximal luminosity of the microcavity during operation. In constructing an OLED microcavity, a depositing step can comprise depositing a first organic buffer layer, or other layer, directly onto the first reflective electrode. The first organic emitting layer can comprise or be deposited directly onto a buffer layer. The first organic buffer layer or other layer can comprise at least one of a hole injection layer, a hole transport layer, an emission layer, an electron transport layer, and an electron injection layer.

Figure 10A:
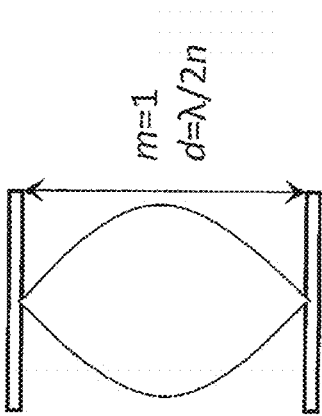
FIG. 10A is a schematic representation of the fundamental mode of a Fabry-Perot (FP) microcavity wherein m=1, the corresponding resonant wavelength is equal to 2n (i.e., $\lambda=2n$), and other wavelengths inside the cavity are suppressed due to the rearranged optical mode density, in accordance with various embodiments of the present teachings.
Figure 10B:
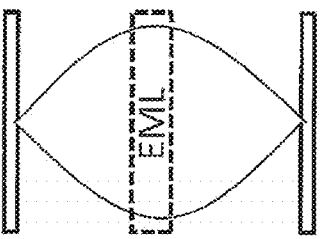
FIG. 10B is a schematic representation of the positioning of an EML relative to the Fabry-Perot (FP) microcavity shown in FIG. 10A, in accordance with various embodiments of the present teachings.

FIGS. 10A and 10B are schematic representations of the fundamental mode of a Fabry-Perot (FP) microcavity where m=1, and the corresponding resonant wavelength is equal to $\lambda=2n$. Other wavelengths due to the rearranged optical mode density inside the cavity are suppressed. A simple co-planar FP microcavity can have a pair of minors of reflectance R and spacing d shown by the arrow in FIG. 10A. The resonant condition of this cavity should satisfy the equation (for optical mode). When the cavity spacing d is doubled (m=2 or $=\lambda/n$), there is one mode overlapped with the emission curve (standing wave) between the two reflectors. For this case, the minor distance equals one wavelength (the peak wavelength of the emission spectrum). In this case the emission is not only determined by the FP microcavity's spacing, but also is strongly dependent on the position of the active layer within the two reflectors, due to the cavity standing wave effect.

Figure 11:
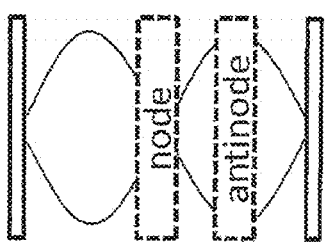
FIG. 11 is a schematic representation of a Fabry-Perot (FP) microcavity mode (m=2) that can be achieved in accordance with various embodiments of the present teachings.

FIG. 11 is a schematic representation of a Fabry-Perot (FP) microcavity mode (m=2) that can be achieved in accordance with the present teachings. FIG. 11 shows that the standing wave's minimum field strength is at the center of the cavity (at a node).

Figure 12:
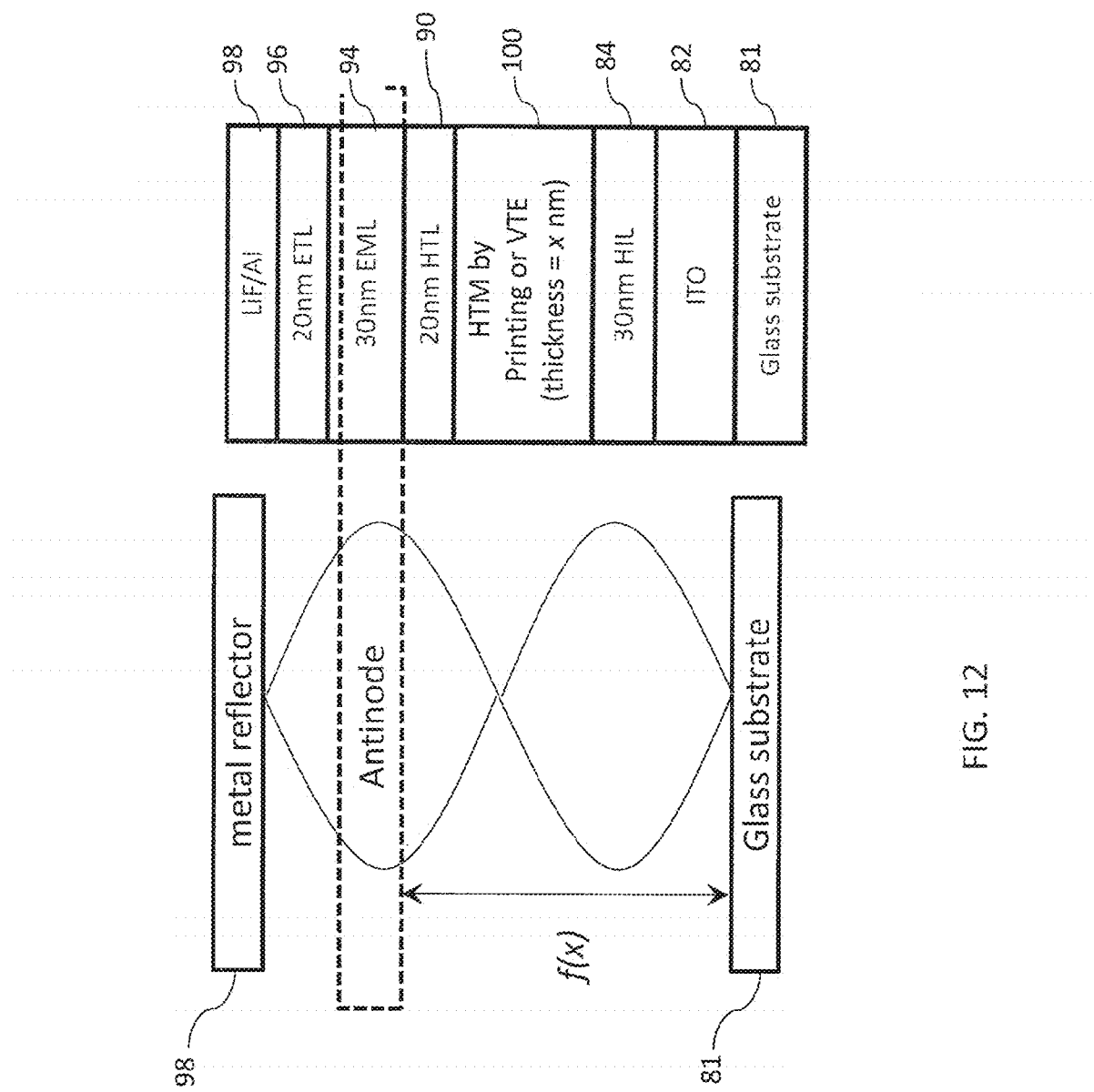
FIG. 12 is a schematic diagram of a device stack wherein a light-emitting layer (EML) is formed at an antinode position of a microcavity and used to enhance light emission, in accordance with various embodiments of the present teachings.

FIG. 12 is a schematic diagram of a device stack and illustrates a light-emitting layer (EML) at an antinode position of a microcavity as used to enhance light emission in accordance with the present teachings. The stack comprises glass substrate 81, anode 82, HIL 84, one or more HTM layers 100, HTL 90, EML 94, ETL 96, and cathode 98. The stack geometry is aligned with a Fabry-Perot microcavity such that EML 94 is in alignment with the antinode of the microcavity and cathode 98 acts a metal reflector. If the light-emitting layer (EML) is positioned at the center/node, its emission will be suppressed. On the other hand, if the EML is positioned at the antinode (as shown) where the field strength of the standing wave is at a maximum, the emission can be enhanced. Based on this simple mode and the microcavity spacing d, the EML position between the two reflectors can both strongly affect the optical emission characteristics, including the emission chromaticity and its brightness, and thus define a microcavity effect.

Figure 13:
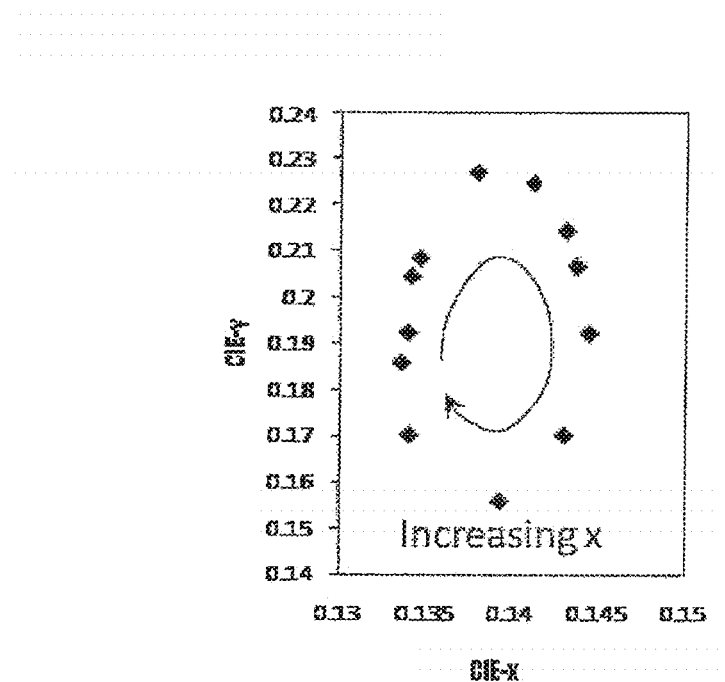
FIG. 13 is a graph showing blue OLED emission chromaticity as a function of HIL2 thickness (x nm) in accordance with various embodiments of the present teachings.

An adjusted hole transport layer (HTL)/hole injection layer (HIL) can effectively smooth the substrate and affect the emission spectrum, including the microcavity effect, as the HTL thickness varies. An example of using a microcavity model to tune the emission spectrum (color) and light emission intensity (brightness) is given in FIG. 13, and Table 1. The Hole Injection Layer II (HIL2) is printed using a thermal printing technique and its thickness is varied from 0 nm to 120 nm. FIG. 13 is a graph showing blue OLED emission chromaticity as a function of HIL2 thickness (x nm) in accordance with the present teachings. As the HIL2 thickness increases, a circular pattern is observed in its emission spectrum (or CIE coordinates) because the resonant optical mode in the microcavity has moved from the fundamental mode (m=1) to the second harmonic mode (m=2), as the HIL2 layer thickness increases.

TABLE 1

| HIL2 Thickness (nm) | CIE-x | CIE-y |
|---|---|---|
| 0 | 0.134 | 0.170 |
| 15 | 0.134 | 0.192 |
| 35 | 0.135 | 0.208 |
| 65 | 0.138 | 0.227 |
| 71 | 0.144 | 0.207 |
| 100 | 0.143 | 0.170 |
| 110 | 0.139 | 0.156 |
| 120 | 0.135 | 0.163 |

Figure 14:
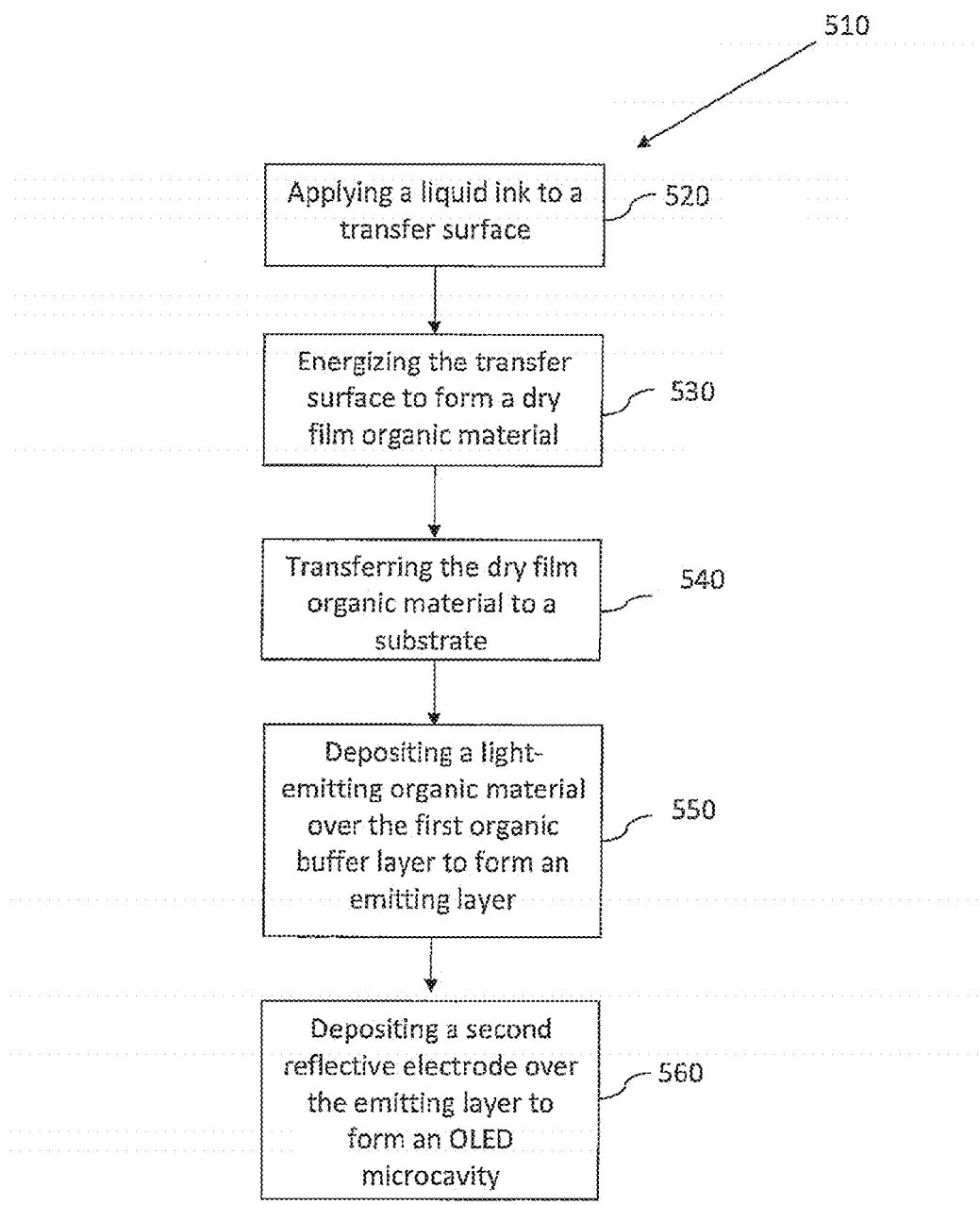
FIG. 14 is a flow diagram of a method of forming a microcavity for an organic light-emitting device in accordance with various embodiments of the present teachings.

A method of forming a microcavity for an organic light-emitting device is provided by the present teachings. The method can comprise an applying step, an energizing step, a transferring step, and a depositing step. For example, FIG. 14 is a flow diagram of a method 510 of forming a microcavity for an organic light-emitting device in accordance with the present teachings. An applying step 520 is shown followed by an energizing step 530, a transferring step 540, a depositing step 550, and a second depositing step 560. A liquid ink can be applied to a transfer surface for forming a layer of an organic light-emitting device. The liquid ink can be defined by a carrier fluid and dissolved or suspended film-forming organic material. The transfer surface can be energized to substantially evaporate the carrier fluid and form a dry film organic material on the transfer surface. The dry film organic material can be transferred from the transfer surface to a substrate such that the dry film organic material is deposited on the substrate in substantially a solid phase. The result is the formation of a first organic buffer layer.

The substrate can comprise a first reflective electrode. The transfer surface can be positioned at a distance of from about 1.0 µm to about 10.0 mm from the substrate during the transferring, for example, at a distance of from about 10.0 µm to about 100.0 µm from the substrate. The dry film organic material can be deposited to build up a layer thickness at a rate of from about 0.1 nm/sec to about 500 nm/sec, for example, at a rate of from about 0.1 nm/sec to about 50 nm/sec.

In some embodiments, the ink is transferred directly to the substrate or organic layer using inkjet printing. Following application of the liquid ink to the substrate, the carrier can be driven off with heat, vacuum, a gas stream, exposure to radiation, or a combination thereof, to form a pre-bake organic layer that can be baked as described above in relation to the thermal printing process.

A light-emitting organic material can be deposited over the first organic buffer layer to form an emitting layer such that the first organic buffer layer is between the substrate and the emitting layer. The light-emitting organic material can emit light at an emission wavelength. A second reflective electrode can be deposited over the emitting layer such that the emitting layer is between the first reflective electrode and the second reflective electrode and an OLED microcavity is formed. At least one of the first and second reflective electrodes can be semi-transparent or translucent. The first reflective electrode and the second reflective electrode can be separated from one another by a distance. The distance can correspond to a depth of the microcavity. The depth of the microcavity can be configured for resonance emission of the emission wavelength of the light-emitting organic material.

A microcavity for an organic light-emitting device is provided by the present teachings. The microcavity can comprise a substrate, a dry film organic material layer, an emitting layer, and a second reflective electrode. The substrate can comprise a first reflective electrode. The dry film organic material layer can be formed on the substrate and comprise a first surface facing the substrate and a second surface opposite the first surface. An emitting layer over the dry film organic material layer can be provided such that the dry film organic material layer is between the first reflective electrode and the emitting layer. The emitting layer can comprise a light-emitting organic material that emits light at an emission wavelength. The second reflective electrode over the emitting layer can be provided such that the emitting layer is between the first reflective electrode and the second reflective electrode. The second surface can exhibit a surface roughness of from about 0.5 nm to about 1.0 µm as the root mean squared of surface thickness deviations in an area of 10 µm$^2$, for example, from about 1.0 nm to about 500 nm, or from about 5.0 nm to about 500 nm. In some embodiments, the area measured is a 10 µm by 10 µm surface. The organic light-emitting device stack can exhibit a luminosity efficiency of from about 1.01 to about 2.0, that is, it can exhibit an increase in luminosity by a factor of from about 1.01 to about 2.0 relative to the luminosity of the same microcavity but with a smooth surface having a surface roughness of less than 5.0 nm expressed as the root mean square of the surface thickness deviation in an area of 10×10 µm$^2$. At least one of the first and second reflective electrodes can be semi-transparent or translucent. The first reflective electrode and the second reflective electrode can be separated from one another by a distance. The distance can correspond to a depth of the microcavity, and the depth of the microcavity can be configured for resonance emission of the emission wavelength of the light-emitting organic material.

Any microcavity or feature of the same can be employed in the microcavity and method of the present teachings, for example, including those described in U.S. Pat. No. 5,405, 710, U.S. Pat. No. 6,861,800 B2, U.S. Pat. No. 6,917,159 B2, U.S. Pat. No. 7,023,013 B2, and U.S. Pat. No. 7,247,394 B2; U.S. Patent Application Publications Nos. US 2007/0286944 A1 and US 2009/0115706 A1; Huang et al., "Reducing Blue-shift of Viewing Angle for Top-emitting Organic Light-Emitting Devices" (2008); Lee et al., "Microcavity Effect of Top-Emission Organic Light-Emitting Diodes Using Aluminum Cathode and Anode," Bull. Korean Chem. Soc., 2005, Vol. 26, No. 9; Wu et al., "Microcavity Effects in Organic Light-Emitting Devices, Chapter 9, pp. 265-292 in Organic Electronics: Materials, Processing, Devices, and Applications, (So, ed.), CRC Press New York (2010); Bulovic et al., Phys., Rev. B 58: 3730 (1998); and Lee et al., Appl. Phys. Lett. 92 (2008) 033303, which are incorporated herein by reference in their entireties.

The microcavity can incorporate one or more quarter wave stacks (QWS). A QWS is a multi-layer stack of alternating high index and low index dielectric thin-films, each one a quarter wavelength thick. A QWS can be tuned to have high reflectance, low transmittance, and low absorption over a desired range of wavelengths.

The use of a transparent conductive phase-layer is optional. If a transparent conductive phase-layer is used, the combined thickness of the transparent conductive phase-layer and an organic EL medium structure can be selected to tune the microcavity OLED device to have resonance at a predetermined wavelength. For example, such predetermined wavelength can correspond to a center-wavelength of one of red, green, or blue light emitted from the microcavity OLED device constructed in accordance with the present teachings. The thickness can satisfy the following equation:

$$2\Sigma n_i L_{i+2} N_s L_s + (Q_{m1}+Q_{m2})\lambda/2\pi = m\lambda$$

wherein $n_i$ is the index of refraction and $L_i$ is the thickness of the ith sublayer in the organic EL medium structure, $n_s$ is the index of refraction, $L_s$ is the thickness, which can be zero, of transparent conductive phase-layer, $Q_{m1}$ and $Q_{m2}$ are the phase shifts in radians at the two organic EL medium structure metal electrode interfaces, respectively, $\lambda$ is the predetermined wavelength to be emitted from the device, and m is a non-negative integer. For ease of manufacturing considerations and for color purity, it is preferred to have m equal to 1 for the blue pixels and equal to 0 or 1 for the green and red pixels.

The distance between the anode and cathode helps determine the microcavity resonance wavelength. The resonance wavelength, and more particularly, the strength of the resonance, along with the resulting efficiency of the device, also depend on the distance between the EML and each of the two electrodes. In particular, for optimal device performance, the distance between an electrode and the center point of the EML can approximately satisfy the following equation:

$$2\Sigma n_i L_s + Q_{m1}\lambda/2\pi = m_D\lambda$$

wherein $n_i$ is the index of refraction, $L_i$ is the thickness of the ith sublayer in the organic EL medium structure, $Q_{m1}$ is the phase shift in radians at the organic EL medium structure metal cathode interface, $\lambda$ is the predetermined wavelength to be emitted from the device, and $m_D$ is a non-negative integer.

To help minimize the absorption of light by the light transmissive metallic electrode, a high index of refraction absorption-reducing layer can be employed between the light transmissive electrode and the substrate. The absorption-reducing layer can reduce an electric field produced by a light wave, and absorb the light wave, within the light transmissive electrode. To a good approximation, this result can be accomplished by having the electric field of the light wave reflected back, from the interface between this absorption-reducing layer and the substrate, such that it interferes destructively with, and thus partly cancels, the electric field of the light passing out of the device. For an absorption-reducing layer having a higher index of refraction than the substrate, the following equation can be approximately satisfied:

$$2n_A L_A + n_T L_T = (m_A + \tfrac{1}{2})\lambda$$

where $n_A$ and $L_A$ are the index of refraction and the thickness of absorption-reducing layer respectively, $n_T$ and $L_T$ are the real part of the index of refraction and the thickness of light transmissive metallic bottom-electrode, respectively, and $m_A$ is a non-negative integer. The value of $m_A$ can be as small as practical, for example, from about 0 to about 2. The beneficial effects of the absorption-reducing layer are generally higher when higher index of refraction materials are used.

The following examples are given to illustrate the nature of the present invention. It should be understood, however, that the present invention is not to be limited to the specific conditions or details set forth in these examples.

EXAMPLES

Example 1

This example demonstrates the functional and superior properties of the OLED components and methods of producing the same, in accordance with the present teachings. For a 100 nm thick film, 2 drops of ink (about 12 picoliters) were applied @ 1.2% ink concentration @ 100 HZ. The loading temperature was 150° C. A boil-off temperature of about 250° C. was used for a period of from about 200 milliseconds to about 1.0 second. A 250° C.-380° C. temperature ramp was then used for a period of from about 200 milliseconds to 800 milliseconds to evaporate the solids. A 350° C.-900° C. clean temperature was then used. The print pitch was about 50 μm. The as-deposited film looked hazy and the AFM surface roughness greater than 5.0 nm. The printed film was subjected to a post-bake at from about 150° C. to about 200° C. for from about 10 seconds to about 5.0 minutes, on a hot plate in a nitrogen environment. Atomic force microscopy (AFM) data confirms the surface roughness was reduced to 2 nm or less.

The apparatuses, systems, and methods described herein are exemplary in nature, and other materials and structures can be used. Functional OLEDs can be achieved by combining the various layers described in different ways, or layers can be omitted entirely, for considerations such as design, performance, and cost factors. Other layers not specifically described can also be included. Materials other than those specifically described can be used. Although many of the exemplary embodiments provided herein describe various layers as comprising a single material, it is understood that combinations of materials, such as a mixture of host and dopant, or more generally, a mixture, can be used. Also, the layers can have various sublayers. The names given to the various layers herein are not intended to be strictly limiting. For example, a hole transport layer that transports holes and injects holes into an emissive layer can be described as a hole transport layer or as a hole injection layer or as an HTL/HIL. An OLED can be described as having an "organic layer" disposed between a cathode and an anode. This organic layer can comprise a single layer, or can further comprise multiple layers of different organic materials as described herein.

Materials, systems, and methods not otherwise described can also be used, such as OLEDs comprised of polymeric materials (PLEDs) including those described in U.S. Pat. No.

5,247,190, which is incorporated herein by reference in its entirety. By way of further example, OLEDs having a single organic layer can be used. OLEDs can be stacked, for example, as described in U.S. Pat. No. 5,707,745 to Forrest et al, which is incorporated herein by reference in its entirety. For example, the substrate can include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated herein by reference in their entireties.

Although at least one layer is deposited by thermal or inkjet printing, any layer can instead or additionally be deposited by any suitable method. For the organic layers, methods can include thermal evaporation methods, inkjet methods such as described in U.S. Pat. Nos. 6,013,982 and 6,087,196 (which are incorporated herein by reference in their entireties), organic vapor phase deposition (OVPD) methods, such as described in U.S. Pat. No. 6,337,102 B1 to Forrest et al. (incorporated herein by reference in its entirety), and organic vapor jet printing (OVJP) methods such as described in U.S. Pat. No. 7,431,968 B1 (incorporated herein by reference in its entirety). OVPD is a separate and distinct technique from the thermal printing technique described herein. Other suitable deposition methods can include spin coating and other solution based processes. Solution based processes are preferably carried out in nitrogen or other inert atmospheres. For the other layers, other methods include thermal evaporation. Patterning methods that can be used include deposition through a mask, cold welding such as described in U.S. Pat. Nos. 6,294,398 and 6,468,819 (incorporated herein by reference in their entireties), and patterning associated with deposition methods such as inkjet and OVJP.

Devices fabricated in accordance with the present teachings can be incorporated into a wide variety of consumer products, such as flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms can be used to control devices fabricated in accordance with the present teachings, including passive matrix and active matrix control mechanisms. The apparatuses, methods, and systems described herein can have applications in devices other than OLEDs. Examples of such other applications include optoelectronic devices such as organic solar cells and organic photodetectors, as well as organic devices such as organic transistors.

The utilization of a microcavity in OLEDs in accordance with the present teachings can provide the following advantages: improving color purity through spectrum narrowing, enhancing EML efficiency and brightness, and forming organic lasers. The depth of the microcavity can be adjusted to achieve a laser of desired wavelength. Stimulated emission occurs within the microcavity to produce coherent light. An electrode can be provided with an aperture of desired size and shape to permit a laser beam to exit the microcavity.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein can be employed in practicing the disclosure.

What is claimed is:

1. A method of forming a microcavity for an organic light-emitting device (OLED), the method comprising:
depositing an ink from an inkjet printhead onto a substrate comprising a first reflective electrode, to form a printed layer, the ink being defined by a carrier and dissolved or suspended film-forming organic material;
driving off the carrier from the printed layer to form a first organic buffer layer on the substrate, wherein the first organic buffer layer formed using the organic film-forming material exhibits a glass transition temperature range;
baking the first organic buffer layer at a bake temperature of from within the glass transition temperature range to above the glass transition temperature range, to form a crystalline organic layer having a conductivity of from about $1.0 \times 10^{-9}$ S/m to about $1.0 \times 10^{-1}$ S/m;
depositing a light-emitting organic material over the first organic buffer layer to form an emitting layer such that the first organic buffer layer is disposed between the substrate and the emitting layer, the light-emitting organic material emitting light, upon excitation, at a peak emission wavelength; and
depositing a second reflective electrode over the emitting layer such that the emitting layer is disposed between the first reflective electrode and the second reflective electrode, to form an OLED microcavity;
wherein at least one of the first and second reflective electrodes is semi-transparent, the first reflective electrode and the second reflective electrode are separated from one another by a distance, the distance corresponds to a depth of the microcavity, and the depth of the microcavity is configured for resonance emission of the peak emission wavelength.

2. The method of claim 1, wherein the carrier fluid is driven off by at least one of a vacuum, heating, a gas stream, exposure to radiation, or a combination thereof.

3. The method of claim 1, wherein the emitting layer is spaced from the first reflective electrode by a first distance and spaced from the second reflective electrode by a second distance, and the first and second distances are optimized for maximum luminosity of the microcavity during operation.

4. The method of claim 1, wherein the depositing an ink comprises depositing a liquid ink directly onto the first reflective electrode.

5. The method of claim 1, wherein the emitting layer is deposited directly onto the first organic buffer layer.

6. The method of claim 1, wherein the first organic buffer layer comprises at least one of a hole injection layer, a hole transport layer, an electron transport layer, and an electron injection layer.

7. The method of claim 1, wherein baking the first organic buffer layer comprises baking at a first bake temperature of from about 50° C. to about 250° C. for a first bake time of from about 5.0 milliseconds to about 5.0 hours.

8. The method of claim 1, wherein baking the first organic buffer layer comprises baking at a first bake temperature of from about 50° C. to about 250° C. for a first bake time of from about 5.0 milliseconds to about 5.0 hours, to form a first baked organic layer for the organic light-emitting device.

9. The method of claim 8, wherein at least one of the bake temperature, the bake time, the concentration of the film-forming organic material in the ink, and the thickness of the first organic buffer layer, are adjusted such that the first baked organic layer exhibits a porous structure.

10. The method of claim 8, wherein at least one of the bake temperature and bake time are adjusted so that the first baked organic layer exhibits a rough character.

11. The method of claim 8, wherein at least one of the bake temperature and bake time are adjusted so that the first baked organic layer exhibits a smooth character.

12. The method of claim 11, wherein at least one of the bake temperature, the bake time, the concentration of the film-forming organic material in the ink, and the thickness of the first organic buffer layer, are adjusted such that the first baked organic layer has a surface roughness of from about 0.5 nm to about 10 nm expressed as the root mean square of the surface thickness deviation in an area $10 \times 10$ $\mu m^2$.

13. The method of claim 11, wherein at least one of the bake temperature, the bake time, the concentration of the film-forming organic material in the ink, and the thickness of the first organic buffer layer, are adjusted such that the first baked organic layer has a surface roughness of less than 5.0 nm expressed as the root mean square of the surface thickness deviation in an area of $10 \times 10$ $\mu m^2$.

14. The method of claim 1 wherein the bake temperature is from about 250° C. to about 450° C. and the first organic buffer layer is heated at the bake temperature for a bake time of from about 5 milliseconds to about 5.0 hours.

15. The method of claim 1 wherein the crystalline organic layer has a crystallinity as measured by an average grain size of from about 0.5 nm to about 100 $\mu m$.

16. The method of claim 1 wherein the crystalline organic layer comprises at least one of a hole injection layer, a hole transport layer, an electron transport layer, and an electron injection layer.

17. The method of claim 1, further comprising:
depositing a second ink from an inkjet printhead to the first organic buffer layer, the second ink being defined by a second carrier and dissolved or suspended film-forming organic material; and
driving off the second carrier to form an organic material layer on the first organic buffer layer;
wherein the first reflective electrode is semi-transparent and the first organic buffer layer exhibits a refractive index that is intermediate between a refractive index of the substrate and a refractive index of the organic material layer.

18. The method of claim 17, wherein the refractive index of the substrate is from about 1.01 to about 1.55 and the refractive index of the organic material layer is from about 1.60 to about 5.01.

19. An organic light-emitting device (OLED) microcavity formed by the method of claim 1.

* * * * *